(12) United States Patent  
Tanaka et al.

(10) Patent No.: US 6,992,766 B2  
(45) Date of Patent: Jan. 31, 2006

(54) POSITION DETECTION APPARATUS AND METHOD

(75) Inventors: Hiroshi Tanaka, Tochigi (JP); Takuji Maruta, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 313 days.

(21) Appl. No.: 10/382,518

(22) Filed: Mar. 7, 2003

(65) Prior Publication Data

US 2003/0174330 A1    Sep. 18, 2003

(30) Foreign Application Priority Data

Mar. 15, 2002 (JP) ............................. 2002-072553  
Feb. 21, 2003 (JP) ............................. 2003-044482

(51) Int. Cl.  
    *G01B 11/00* (2006.01)
(52) U.S. Cl. ..................................... 356/401; 250/548
(58) Field of Classification Search ........ 356/399–401; 355/52–55, 67–71, 77; 250/548  
    See application file for complete search history.

(56) References Cited

U.S. PATENT DOCUMENTS

| 5,249,016 | A | 9/1993 | Tanaka ........................ 355/53 |
| 5,543,921 | A | 8/1996 | Uzawa et al. ................ 356/401 |
| 5,774,575 | A | 6/1998 | Tanaka et al. ............... 382/149 |
| 6,521,385 | B2 * | 2/2003 | Yoshida et al. ................ 430/22 |
| 6,803,592 | B2 * | 10/2004 | Yoshida ....................... 250/548 |
| 2002/0036777 | A1 | 3/2002 | Tanaka ........................ 356/401 |
| 2002/0154283 | A1 | 10/2002 | Tanaka et al. ................. 355/53 |
| 2004/0223157 | A1 * | 11/2004 | Nakajima ................... 356/401 |

FOREIGN PATENT DOCUMENTS

| JP | 10-97983 | 4/1998 |
| JP | 2000-260699 | 9/2000 |

* cited by examiner

*Primary Examiner*—Layla G. Lauchman  
(74) *Attorney, Agent, or Firm*—Fitzpatrick, Cella, Harper & Scinto

(57) ABSTRACT

A method of detecting a position of a mark within image data. The method includes a first step of obtaining a first position of the mark based on a first degree of correlation between a first template and the image data, the first template having a first feature point to obtain the first degree of correlation, a second step of obtaining a second position of the mark based on a second degree of correlation between a second template and the image data, the second template having a second feature point, of which a position is different from that of the first feature point, to obtain the second degree of correlation, and a third step of detecting the position of the mark through the first and second steps.

18 Claims, 20 Drawing Sheets

FIG. 4B  FIG. 4C

Over  Under

Left  Right

FIG. 4D  FIG. 4E

FIG. 5A
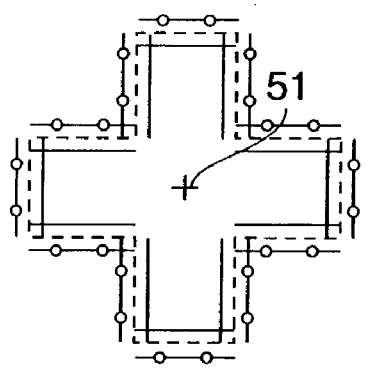
FIG. 5B  FIG. 5C
Over  Under
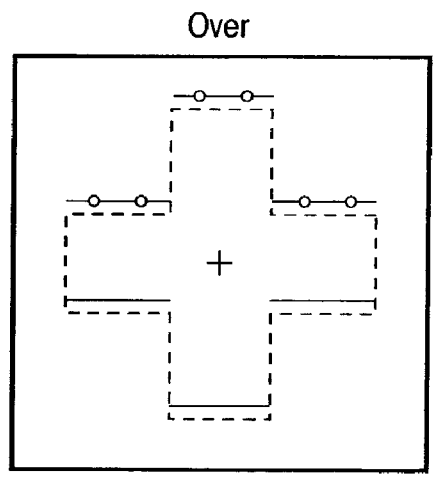 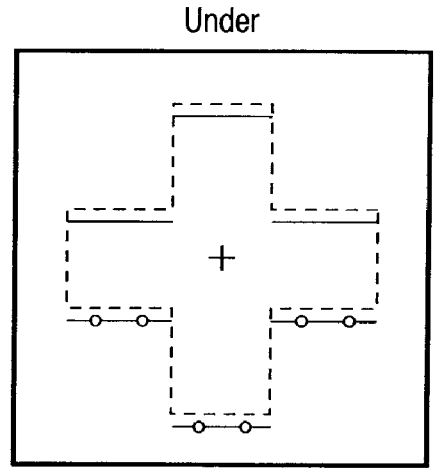
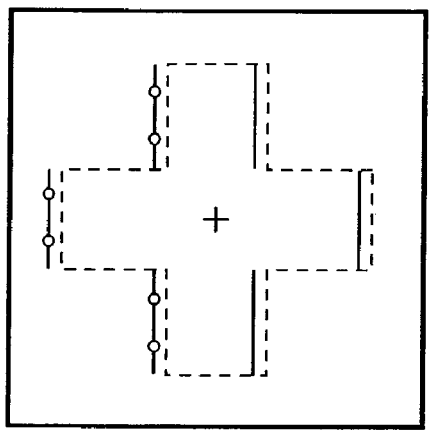 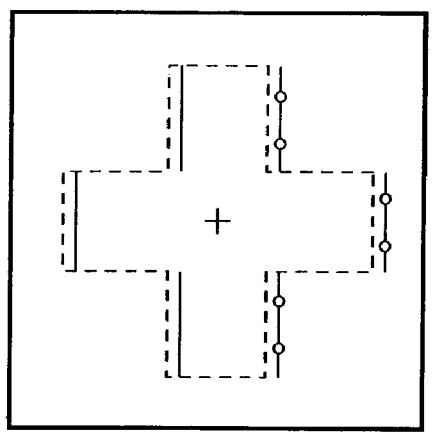
Left  Right
FIG. 5D  FIG. 5E

FIG. 6A
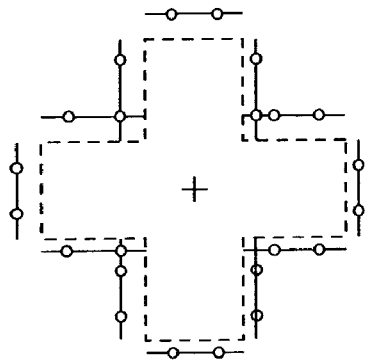
FIG. 6B
Over
FIG. 6C
Under
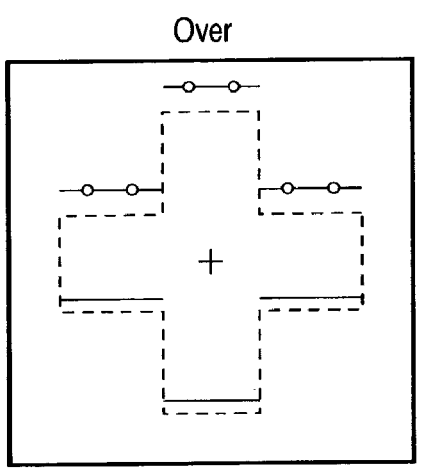
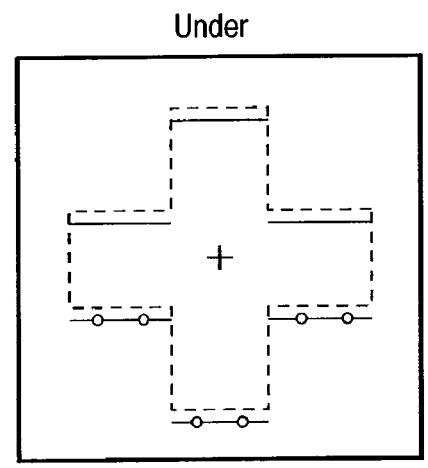
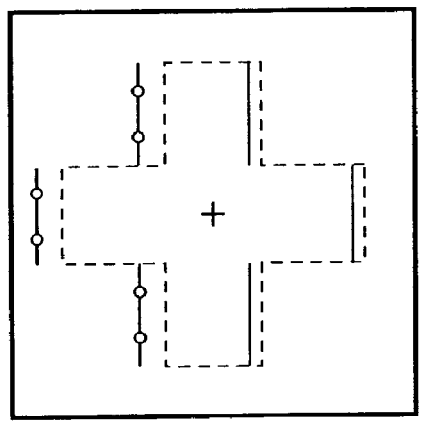
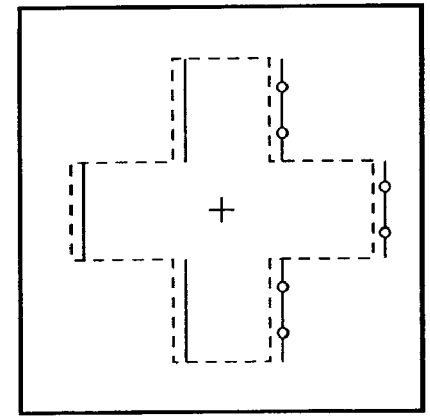
Left
Right
FIG. 6D
FIG. 6E

FIG. 6F
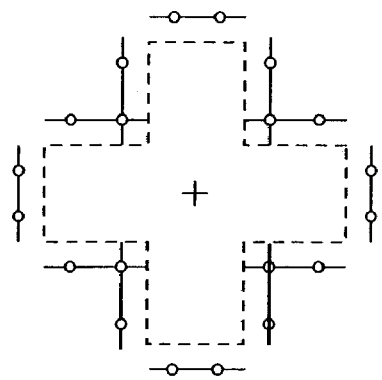
FIG. 6G
Over
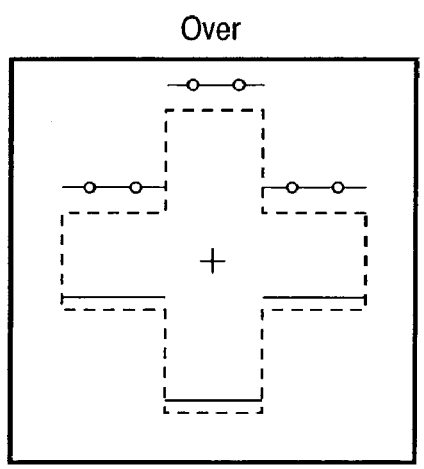
FIG. 6H
Under
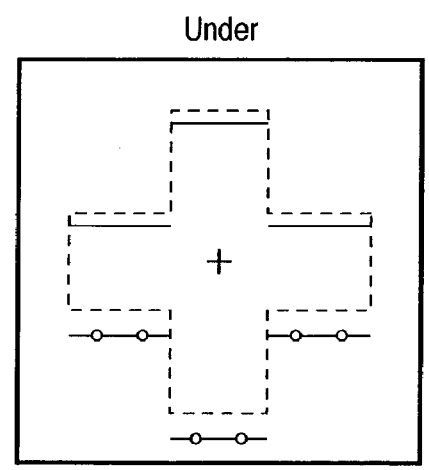
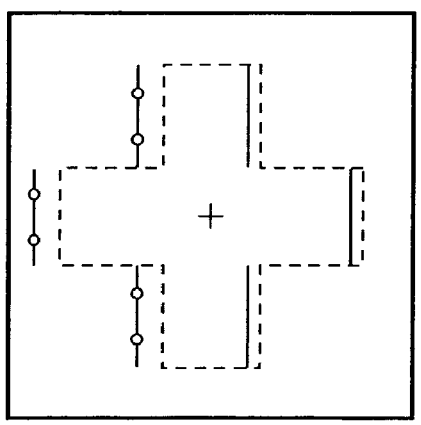
Left
FIG. 6I
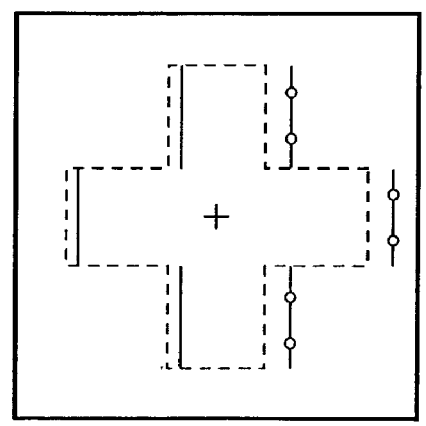
Right
FIG. 6J

FIG. 7A
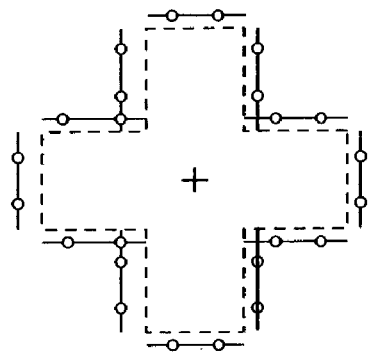
FIG. 7B  FIG. 7C
Over
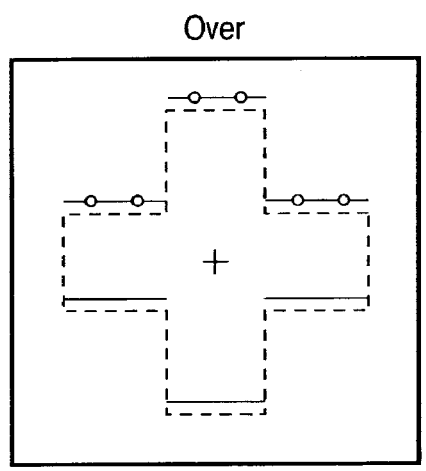
Under
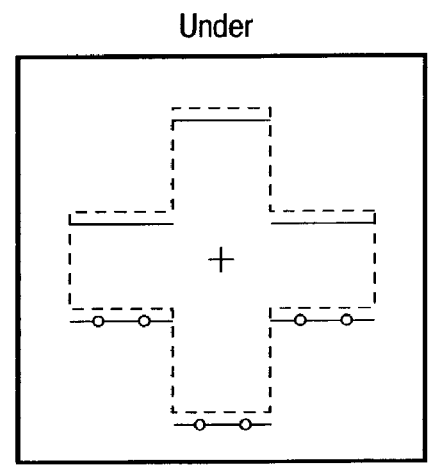
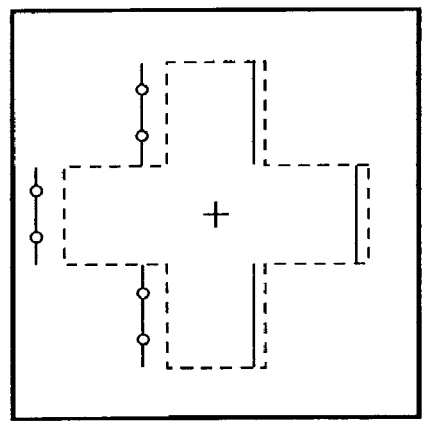
Left
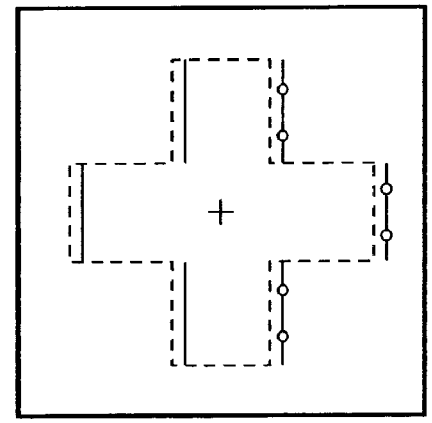
Right
FIG. 7D  FIG. 7E Over Under Left Right Over Under No Edge Left Right

POSITION DETECTION APPARATUS AND METHOD

FIELD OF THE INVENTION

The present invention relates to a position detection apparatus and method, which can suitably be used to detect a pattern position on a wafer in a semiconductor exposure apparatus.

BACKGROUND OF THE INVENTION

When a reticle pattern is to be projected and exposed onto a wafer, the wafer and reticle are aligned to each other first. Then, exposure is performed. In an alignment technique, two alignment processes, i.e., prealignment and fine alignment are executed using an alignment mark formed on a wafer. Prealignment aims at detecting a feed shift amount that is generated when a wafer transferred by a wafer transfer apparatus is placed on a wafer chuck arranged on a stage in an exposure apparatus, and roughly aligning the wafer within an accuracy range that allows a normal fine alignment process. Fine alignment aims at accurately measuring the wafer position on the stage and accurately aligning the wafer such that the alignment error with respect to the reticle falls within an allowable range. Prealignment requires an accuracy of about 3 $\mu$m. Accuracy required for fine alignment changes depending on the required wafer process accuracy. For example, a 64-M DRAM requires an accuracy of 80 nm or less.

In prealignment, a feed shift that is generated when the transfer apparatus transfers the wafer onto the chuck must be detected, as described above. For this purpose, a very wide range must be detected. Generally, a 500-$\mu$m square range is detected. Pattern matching is often used to detect the X- and Y-coordinates of an alignment mark in such a wide range.

Pattern matching processes of this type are roughly classified into two methods. As one method, an image is binarized, matching between the image and a template prepared in advance is performed, and a position with the highest correlation is detected as the mark position. As the other method, a halftone image is directly correlated with a template having halftone information. Normalized correlation is often used in the latter method.

In the above-described pattern matching processes, it is difficult to detect the alignment mark in a low-contrast image, a noise image, or an image having a defect generated at the time of a wafer process. The present applicant has proposed in Japanese Patent Laid-Open No. 2000-260699, a mark detection method that allows stable detection for such an image whose alignment mark is difficult to detect. As a characteristic feature of this method, mark edges are suitably detected, the directional features of the edges are simultaneously detected, and pattern matching is performed on the basis of the edges of the respective direction components.

In prealignment, a very wide range is detected, though the alignment mark is small. This is because the alignment mark is a pattern that does not constitute the semiconductor pattern. To make the area of a semiconductor element as large as possible, the alignment mark must be small. For this reason, the alignment mark is often formed in a region that is not used as an element, e.g., a scribing line. Generally, the mark size is determined by the width of the scribing line.

As the semiconductor manufacturing process becomes more efficient, and the process accuracy increases in recent years, the width of a scribing line decreases year by year. A scribing line is now as thin as 100 $\mu$m or less. Hence, a detection mark size formed within such a scribing line is also as small as 60 $\mu$m or less. Additionally, to manufacture a high-density semiconductor device, various kinds of wafer processes are executed.

In alignment, a mark formed on an underlying layer is detected. In a semiconductor element manufacturing process, layers are formed on the mark one after another. This may sometimes change the shape of the mark. FIG. 9 shows an example of a change in mark line width of a detection mark. Referring to FIG. 9, a mark having a size WO equal to the design value can easily be detected if the template has its design value. However, when various kinds of films are stacked on the step structure of the detection mark during the process, the mark line width becomes smaller or larger. In the example shown in FIG. 9, the mark line width WO decreases to WP. In this case, it is difficult to detect the mark by a template prepared in advance.

Furthermore, if a mark is to be detected using a bright-field illumination method, various changes occur in the observation state due to the difference in reflectance between the mark and the peripheral portion. FIGS. 8A to 8L show an example of such a state. FIGS. 8A to 8F show a case wherein a substance having a low reflectance is used as the underlying layer of the mark, and a substance having a high reflectance is stacked on the mark. FIG. 8B shows the step structure of a detection mark formed by etching a substance having a high reflectance. FIG. 8C shows a change in reflectance of a mark WIN portion. FIG. 8D shows a change in brightness of the WIN portion. In the two-dimensional image of the mark, the mark looks black, and the peripheral portion looks white, as shown in FIG. 8A.

When the substances are changed to those having reflectances with a relationship reverse to that shown in FIG. 8A, an image as shown in FIG. 8G is obtained, and the bright and dark portions are reversed.

Examples of conventionally proposed mark detection methods using template matching are template matching using a binary image or normalized correlation. In these processes, a change in brightness of a mark cannot be detected. Hence, in these correlation processes, a template corresponding to the brightness must be prepared in advance.

As described above, along with the progress in technology for manufacturing a high-density semiconductor element, it becomes very difficult to detect an alignment mark which is present in a wide detection region and is deformed during the processes.

To avoid the problem that an alignment mark cannot be detected due to deformation, a method of storing the feature of a mark portion from the image every time a detection error occurs, and using the stored image as a template, is generally used. Alternatively, a method of manually rewriting template information until the mark can be detected, as disclosed in Japanese Patent Laid-Open No. 10-97983, is used. With these methods, alignment cannot be completed unless operation is performed manually. In addition, if the condition of the multi-layered structure changes, the mark cannot be detected. Especially, recent semiconductor factories with a high degree of cleanness exclude manual operation of apparatuses. For this reason, if manual operation is intervened, the downtime of a semiconductor exposure apparatus becomes longer, resulting in a decrease in production efficiency.

In the field of semiconductor device manufacturing in recent years, techniques for increasing the silicon diameter, decreasing the pattern width, and forming a multi-layered interconnection structure have been developed in order to mass-produce high-capacity, high-speed, and high-performance semiconductor devices at a high yield. Accordingly, the requirements for the flatness of wafers serving as substrates are becoming more strict. To increase the flatness of wafers, a repetitive pattern serving as a dummy may sometimes be formed during the wafer processes. When a number of such patterns is uniformly formed on a wafer at a small interval, a pattern layout like the edge information of a mark disclosed in Japanese Patent Laid-Open No. 2000-260699 may be formed.

Since the purpose of alignment is to find an alignment mark which determines the wafer position from a wide visual field, an unintended pattern may sometimes enter the visual field. Assume that a constituent element (the position and direction of an edge) of such a pattern in the visual field is similar to the template by accident. In this case, if conventional template matching is performed, not the coordinates of the mark portion but the pattern similar to the edge information of the mark may be erroneously detected as coordinates with a high degree (value) of correlation.

This phenomenon will be described in detail with reference to FIG. 10. FIG. 10 shows a wafer surface including a prealignment mark 251 and hole-shaped patterns 253. The cross-shaped (solid line) pattern in FIG. 10 is the prealignment mark 251. Each pattern having a circle shape is the hole-shaped pattern 253. Since the small hole-shaped patterns 253 are uniformly formed on the wafer at a small interval, a cross shape similar to the prealignment mark 251 is formed, as indicated at a detection position 252. This shape has a pattern layout similar to the edge information of the mark in terms of image processing.

When template matching is performed for the wafer shown in FIG. 10, not coordinates responding to the prealignment mark 251, but coordinates (a cross indicated by the dotted line (detection position 252 )) in the hole-shaped patterns 253 may be erroneously detected as coordinates with a high degree of correlation.

SUMMARY OF THE INVENTION

The present invention has been made in consideration of the above problem, and has as its object to allow stabler mark detection even when the mark changes during the manufacturing process.

It is another object of the present invention to provide a mark detection method and apparatus capable of flexibly coping with a change in mark brightness.

It is still another object of the present invention to prevent any mark detection error and more reliably detect a predetermined mark.

According to the present invention, the foregoing object is attained by providing a position detection method of detecting a position of a detection mark, comprising:

a matching step of calculating a value of correlation using a template for an image including the detection mark;

a change step of changing the template to be used for the correlation;

a repeat step of, when a value of correlation in the matching step is not more than a predetermined value, changing the matching processing while changing the template in the change step; and a step of performing position detection on the basis of a result of correlation in the matching step or the repeat step.

According to the present invention, the foregoing object is attained by providing a position detection method of detecting a position of a detection mark, comprising:

a holding step of holding, in holding means, a template which specifies edge positions and non-edge positions for the detection mark;

a matching step of calculating a value of correlation on the basis of a fact that an edge extracted from an image is present at the edge position and not present at the non-edge position; and a determination step of determining the position of the detection mark in the image on the basis of the value of a correlation calculated in the matching step.

According to the present invention, the foregoing object is attained by providing a position detection apparatus for detecting a position of a detection mark, comprising:

holding means for holding a template which specifies edge positions and non-edge positions for the detection mark;

matching means for calculating a value of a correlation on the basis of a fact that an edge extracted from an image is present at the edge position and not present at the non-edge position; and determination means for determining the position of the detection mark in the image on the basis of the value of a correlation calculated by the matching means.

Also, according to the present invention a semiconductor manufacturing method if provided, in which the above position detection method is utilized.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIGS. 4A to 4E are views for explaining detection mark edge extraction according to the first embodiment;

FIGS. 5A to 5E are views for explaining a standard template and matching processing according to the embodiment;

FIGS. 6A to 6E are views for explaining deformation of a template in the X and Y directions in the embodiment and, more particularly, a state wherein a portion corresponding to one pixel has been deformed;

FIGS. 6F to 6J are views for explaining the deformation of the template in the X and Y directions in the embodiment and, more particularly, a state wherein a portion corresponding to two pixels has been deformed;

FIGS. 7A to 7E are views for explaining deformation of a template in the X direction in the embodiment and, more particularly, a state wherein a portion corresponding to one pixel has been deformed;

DETAILED DESCRIPTION OF THE PREFERRED EMBODIMENTS

Preferred embodiments of the present invention will now be described in detail in accordance with the accompanying drawings.

<First Embodiment>

This embodiment implements stabler mark detection for an alignment mark image that is difficult to detect because of deformation of the mark line width or a change in mark brightness. For this purpose, template optimization processing and a self-learning function, which cope with deformation of a mark to be detected and a change in brightness, are added to pattern matching disclosed in Japanese Patent Laid-Open No. 2000-260699, which has an excellent effect in detecting a low-contrast image, a noise image, or an image having a defect generated at the time of a wafer process.

The evaluation of the pattern matching of Japanese Patent Laid-Open No. 2000-260699 is based on that a template which represents a spatial position and the directivity of a pixel at that position is used. Template optimization according to this embodiment, which copes with deformation of a mark, is performed by repeating template matching while executing an operation of reducing or enlarging a spatial position and, more particularly, a portion corresponding to the line width of a template. In this embodiment, optimization which copes with a change in mark brightness is performed by an operation of reversing the directivity of a template. In addition, self-learning is a function of storing an immediately preceding optimized template for template matching processing of next and subsequent times.

Figure 2A:
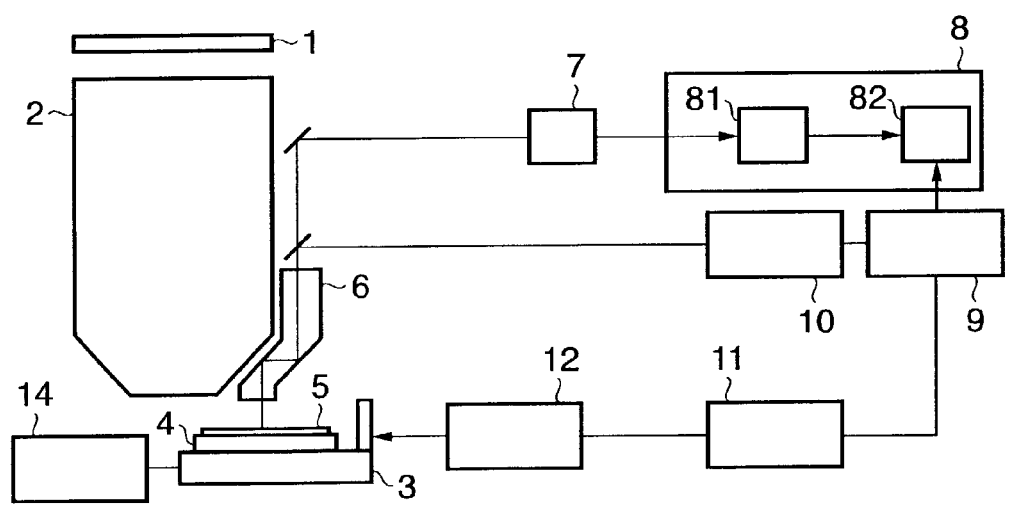
FIG. 2A is a view showing the schematic arrangement of a semiconductor exposure apparatus according to the first embodiment.

Prealignment operation will be described first with reference to FIG. 2A. FIG. 2A is a view showing the schematic arrangement of a semiconductor exposure apparatus according to this embodiment. A pattern to be exposed to a wafer is present on a reticle 1. The pattern is illuminated with an i-line or an excimer laser beam from an illumination system (not shown). A wafer 5 is irradiated with the projection light through a projecting lens 2 so that the wafer 5 is exposed.

In prealignment, the wafer is placed on a wafer chuck 4 on an X-Y stage 3 by a wafer transfer apparatus (not shown). The wafer on the chuck is placed there in accordance with the accuracy of the transfer apparatus. Hence, no accurate position measurement for the wafer can be done in this state. To do it, a prealignment (coarse alignment) mark on the wafer is observed with an off-axis scope 6 arranged outside the projecting lens and photoelectrically converted by a CCD camera 7 or the like. The position of the mark is detected by a prealignment image processing apparatus 8. The photoelectrically converted video signal is converted into digital information by an A/D converter 81. The position of the prealignment mark is detected by an image processor 82 having an image memory.

Figure 3:
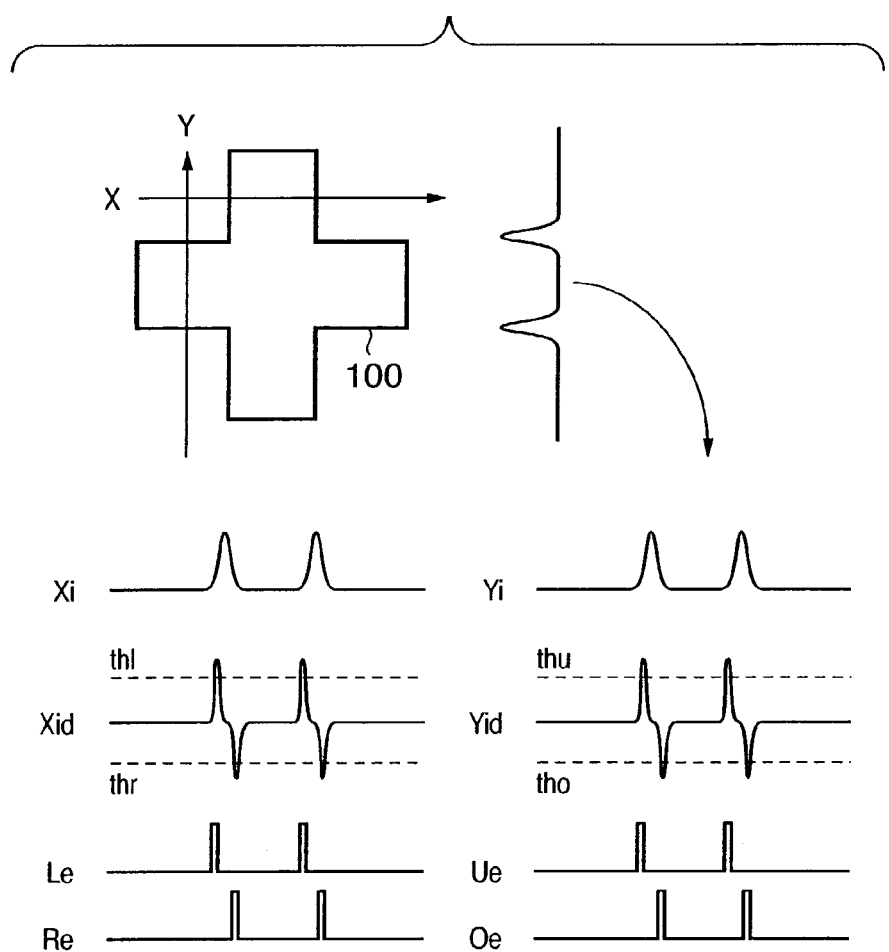
FIG. 3 is a view for explaining a detection mark used in the first embodiment and a detection signal of the mark.

Since it is advantageous for throughput to detect both X- and Y-coordinates by one mark, the alignment mark has the shape of a mark 100 shown in FIG. 3. The position of the stage when the image of the prealignment mark is detected is accurately measured by a laser interference system 12. An exposure control apparatus 9 accurately measures the shift amount of the position of the wafer from the mark position shift and the stage position.

In the first embodiment, dark-field illumination will be exemplified as illumination for the off-axis scope. In the dark-field illumination, scattered light from the edge positions of a mark step is received by the CCD camera or the like. This embodiment can also be applied to bright-field illumination.

Prealignment image processing according to this embodiment will be described next with reference to FIG. 1. The processing to be described below is implemented by causing the CPU (not shown) of the image processor 82 to execute a control program stored in a memory (not shown) such as a ROM.

Figure 1:
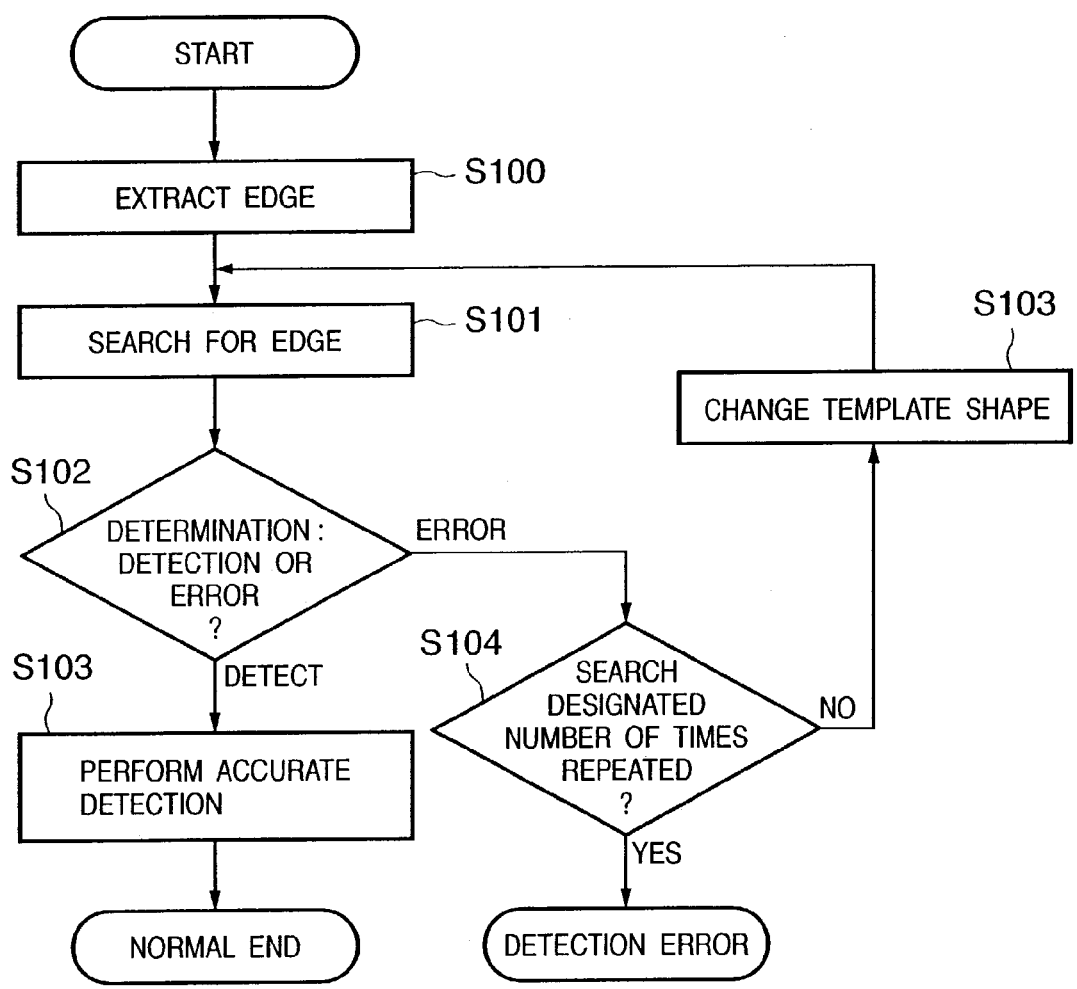
FIG. 1 is a flow chart for explaining prealignment image processing.

FIG. 1 is a flow chart for explaining prealignment image processing. The edges of an image received by the CCD camera 7 are extracted by the image processor 82 to generate edge information (step S100). In edge extraction, information representing the direction of each edge, i.e., information representing that an edge is an over, under, right, or left edge is also simultaneously extracted. In this embodiment, four directions, i.e., upper, lower, left, and right directions are detected. However, four diagonal directions may be added, and a total of eight directions may be detected. Determination whether an edge is an over, under, right, or left edge is done by determining whether the value is larger or smaller than threshold values thl, thr, thu, and tho (to be described later with reference to FIG. 3).

In step S101, edges are searched for from the edge information. Search means that the rough position of the mark is detected from the image. Since the mark shape is known, what kind of edge is present at what kind of position from the center of the mark is known. The two-dimensional layout of the over edge position, under edge position, right edge position, and left edge position is stored as a registered edge layout. Matching between the edge image extracted in step S100 and the registered edge layout is performed.

If the matching result is equal to or more than the detection determination threshold value, mark search is successfully done. The processing advances from step S102 to step S103. In step S103, the detailed position of the mark is measured.

If a search in step S101 fails, the processing advances from step S102 to step S104. If the number of times of the search does not reach the designated number of times yet, the flow advances to step S105 to adjust the template shape by a predetermined method. Then, the flow returns to step S101 to perform a search again. Since already acquired edge information can be used, the processing starts from search processing in step S101. The repetitive loop of template shape deformation and search is controlled by a preset number of times or condition. When it is determined that no mark can be detected even if the repetitive loop is repeated, it is determined as a detection error.

[Edge Extraction (S100)]

The above-described edge extraction in step S100 will be described next. FIGS. 3 and 4A to 4E are views for explaining edge extraction according to this embodiment. The scattered light from the mark 100 is received and photoelectrically converted by the CCD camera 7, A/D-converted by the A/D converter 81, and stored in the memory.

A signal Xi is obtained in a certain X-direction scanning line of the stored image. For the signal, a mark edge portion is bright, and the remaining portions are dark. When the signal Xi is differentiated, a signal Xid is obtained. When the scanning line is viewed from the left, the signal has a positive value at the leading edge of an edge and a negative value at the trailing edge. The threshold value thl is set on the leading edge side of the signal Xid. When the signal is binarized on the basis of the comparison between the value thl and the value of the signal Xid, a signal Le representing edges is obtained. Similarly, when the threshold value thr is set, and the signal Xid is binarized on the basis of the comparison between the value thr and the value of the signal Xid, a signal Re representing edges is obtained. The signal Le represents the left edge positions of the mark signal, and the signal Re represents the right edge positions of the mark signal.

When a signal on a vertical line (Y direction) on the memory is generated, a signal Yi is obtained. The signal Yi is viewed from the lower side. When the signal is differentiated and binarized on the basis of set threshold values as in the X direction, signals Ue and Oe are obtained. The signal Ue represents the under edge positions of the mark signal, and the signal Oe represents the over edge positions of the mark signal.

Figure 4A:
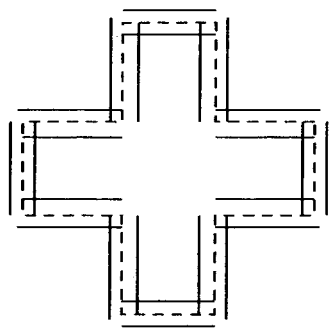
Figure 4A:
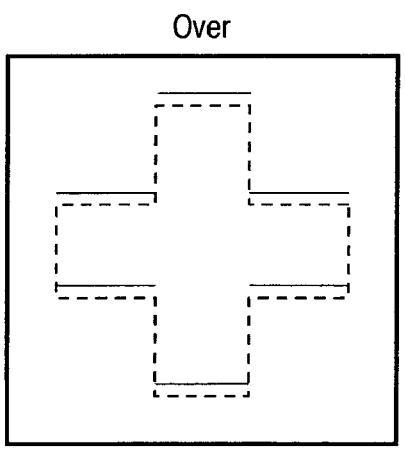
Figure 4A:
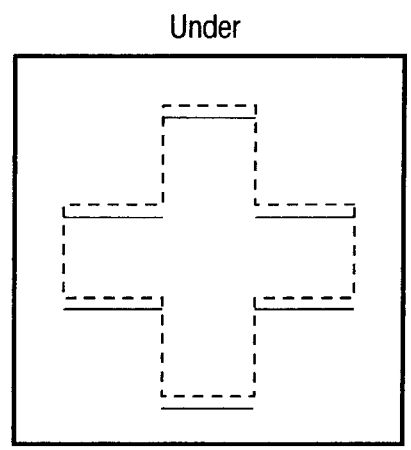
Figure 4A:
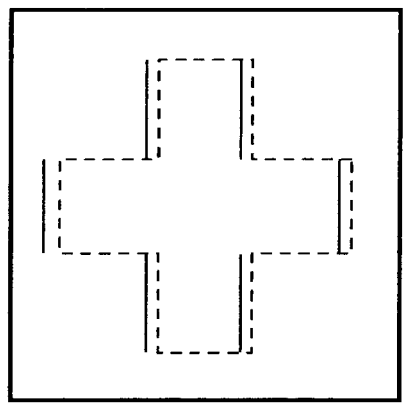
Figure 4A:
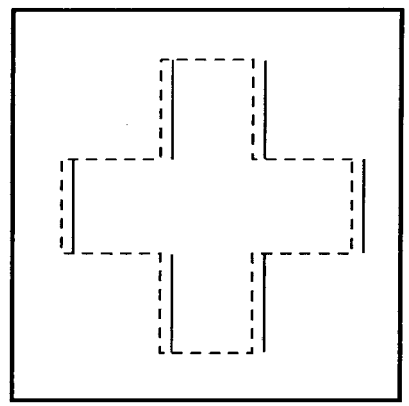
Figure 7F:
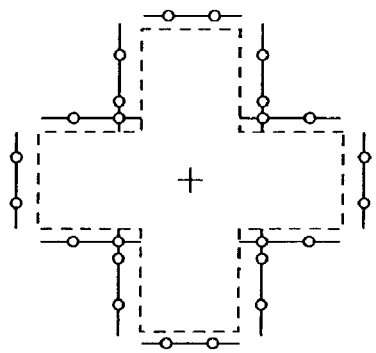
FIGS. 7F to 7J are views for explaining deformation of the template in the X direction in the embodiment and, more particularly, a state wherein a portion corresponding to two pixels has been deformed.
Figure 7G:
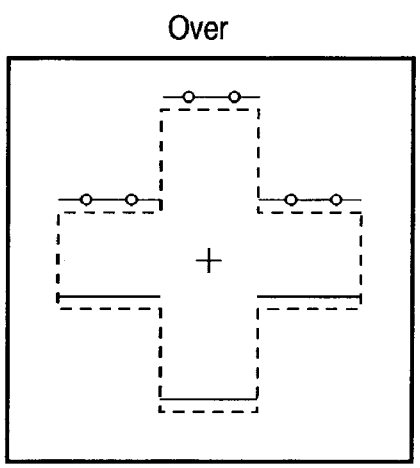
Figure 7H:
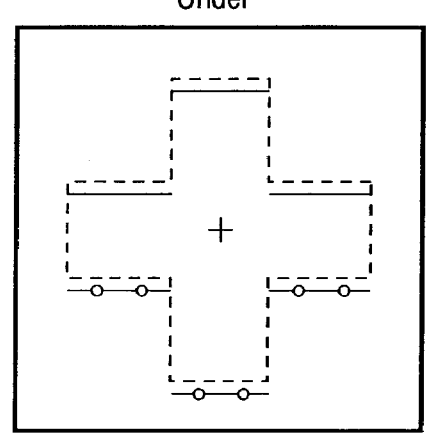
Figure 7I:
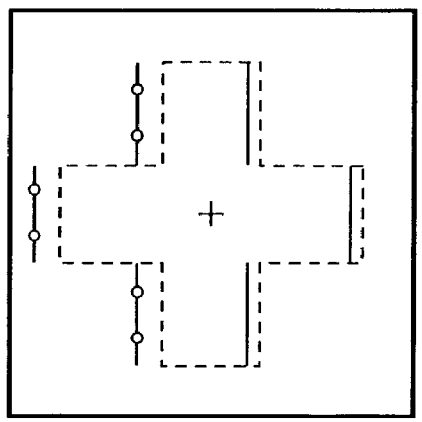
Figure 7J:
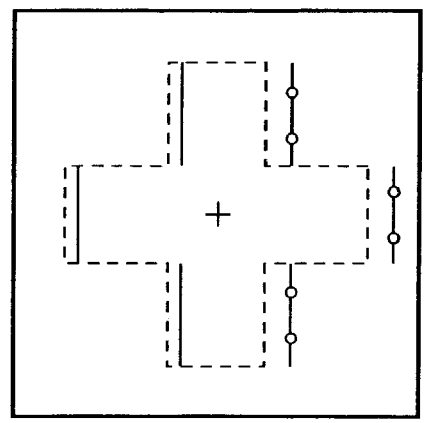

FIGS. 4A to 4E show two-dimensional images when the right edge positions, left edge positions, over edge positions, and under edge positions of the mark 100 are obtained. When these images are synthesized, an image as shown in FIG. 4A is obtained. The over edge positions (FIG. 4B), under edge positions (FIG. 4C), left edge positions (FIG. 4D), and right edge positions (FIG. 4E) are stored as edge position images as independent information.

A search in step S101 is performed by matching calculation between templates stored in advance and the edge position images shown in FIGS. 4B to 4E. The search will be described with reference to FIG. 5. The positions of the over, under, left, and right edges with respect to a mark center (cross) 51 are known in advance. Hence, feature portions of the mark are set at positions indicated by open circles, and layouts as shown in FIGS. 5B to 5E are registered as templates. The upper side (FIG. 5B), lower side (FIG. 5C), left side (FIG. 5D), and right side (FIG. 5E) of the registered templates are synthesized, and a template shown in FIG. 5A is obtained. Each position indicated by an open circle is called a feature point of interest. In this embodiment, a set of points of interest is defined as a template. The template is formed from the positions of feature points of interest and directional features representing the directions of the edges.

[Edge Search (S101)]

For matching calculation in the search, it is determined whether the edge information shown in FIG. 4B is present at the positions indicated by open circles in FIG. 5B with respect to the position of the mark center 51 (cross position). The same determination is also done for FIGS. 4C and 5C, FIGS. 4D and 5D, and FIGS. 4E and 5E. When it is determined that the edge information is present at all the open circle positions, the degree of correlation is 100%. If the edge information is not present at a certain open circle position, the degree of correlation is lower than 100%. This matching calculation is performed for the entire edge image. Finally, the coordinates of a mark position with the highest degree of correlation are extracted, thus ending the search.

The feature points of interest shown in FIGS. 5B to 5E are expressed as interleaved points. Even when the number of points is increased, no effect is obtained unless they express the feature. Even when the feature points of interest are set at a high density, if the correlation decreases, the degree of correlation (correlation coefficient) may abruptly decrease, and the detection/determination may be impossible. In many of such cases, the mark is broken. Hence, a high detection ratio can be maintained when interleaved feature points of interest are set.

In the above-described search, if the value of the detected mark with the highest degree of correlation is smaller than the determination threshold value, the coordinates of the template with which the highest degree of correlation is obtained may not indicate the accurate mark position. That is, the template shape and the shape of the alignment mark formed on the wafer do not match in some cases. In this case, the template is deformed and optimized. Optimization of the template will be described below.

[Change/Optimization of Template Shape (S105)]

Template shape deformation will be described with reference to FIGS. 6A to 6J. Referring to FIGS. 6A to 6J, the template shown in FIG. 5A is defined as a standard shape, i.e., a shape according to the design value, and deformed. FIGS. 6A to 6E show a template larger by one pixel in the X and Y directions. FIGS. 6F to 6J show a template larger by two pixels in the X and Y directions.

As is apparent from FIGS. 6B and 5B, the template shown in FIGS. 6A to 6E and the standard template shown in FIGS. 5A to 5E are different in that each over edge position is moved to the upper side of the standard template by one pixel, and each left edge position is moved to the left side of the standard template by one pixel. In addition, the template shown in FIGS. 6F to 6J and the standard template are different in that each over edge position is moved to the upper side of the standard template by one pixel (FIGS. 6G and 5B), each under edge position is moved to the lower side by one pixel (FIGS. 6H and 5C), each left edge position is moved to the left side by one pixel (FIGS. 6I and 5D), and each right edge position is moved to the right side by one pixel (FIGS. 6J and 5E).

Although not illustrated, a template smaller than the standard template (FIGS. 5A to 5E) by one pixel and a template smaller than the standard template by two pixels are prepared in the same way as described above. For example, the template smaller by one pixel can be obtained by moving each over edge position shown in FIG. 5B to the lower side by one pixel and each left edge position shown in FIG. 5D to the right side by one pixel. The template smaller by two pixels can be obtained by moving each over edge position shown in FIG. 5B, each under edge position shown in FIG. 5C, each left edge position shown in FIG. 5D, and each right edge position shown in FIG. 5E to the lower, upper, right, and left sides, respectively, by one pixel.

For template deformation, not only the above-described four kinds of templates, but also a template larger or smaller than the standard template by three pixels can be used. It is probably efficient to automatically prepare templates deformed in accordance with, e.g., the following rule.

(1) Template larger by one pixel (2) Template smaller by one pixel (3) Template larger by two pixels (4) Template smaller by two pixels (5) Template larger by three pixels (6) Template smaller by three pixels The template deformation and edge search are repeated until the interval corresponding to the line width becomes 1 or less or the interval corresponding to the line width exceeds a presumed deformation amount. If no matching with the template is successfully done even at this time, it is determined as a detection error (S104). The reason why template deformation is repeated while alternately increasing and decreasing the template size is as follows. The mark deformation amount is small at a high probability. Hence, when evaluation is started from a smaller template as much as possible, matching between the template and mark deformation is readily successfully done, and optimization is ended in a shortest time.

The automatic deformed template generation method is not limited to the above-described method. For example, a detection mark may deform only in the X direction or only in the Y direction. Hence, as shown in FIGS. 7A to 7J, the template may be deformed in the X direction. Alternatively, the template may be deformed in the Y direction (not shown), as in FIGS. 7A to 7J. FIGS. 7A to 7E show a template larger in the X direction by one pixel. FIGS. 7F to 7J show a template larger in the X direction by two pixels.

Even for such automatic template generation, it is probably efficient to automatically prepare templates in the following order.

(1) Template larger in the X direction (Y direction) by one pixel (2) Template smaller in the X direction (Y direction) by one pixel (3) Template larger in the X direction (Y direction) by two pixels (4) Template smaller in the X direction (Y direction) by two pixels (5) Template larger in the X direction (Y direction) by three pixels (6) Template smaller in the X direction (Y direction) by three pixels For automatic generation, all conditions that the mark is deformed in both the X and Y directions, the mark is deformed only in the X direction, and the mark is deformed only in the Y direction can be combined, and an optimum automatic template generation procedure can be determined.

When template matching is executed while automatically generating deformed templates, and the maximum degree of correlation exceeds the determination threshold value, it is determined that the automatically generated template has the same shape as that of the mark on the wafer, and optimization is ended. The coordinates at which the maximum degree of correlation is obtained represent the correct mark position. The deformed templates may be held in the memory in advance and read out as needed. However, when a deformed template is calculated every time, it is only necessary to hold the standard template and learned templates. For this reason, the memory can be saved.

The automatically generated templates which can exceed the determination threshold value are stored (self-learned) and used in template matching of next and subsequent times. In template matching of next and subsequent times, the mark on the wafer is deformed at a high probability. When the self-learning is executed, the templates are less than the determination threshold value at a low probability. Hence, the mark position can quickly be detected without repeating template optimization.

If the mark position cannot be detected using the optimum template as the immediately preceding self-learning result, the template (standard template) that coincides with the design value is used again, and template optimization and self-learning are repeated in the above-described way until the maximum degree of correlation exceeds the determination threshold value.

In the above embodiment, optimization is ended when the maximum degree of correlation exceeds the determination threshold value. However, the present invention is not limited to this. For example, (1) a method of executing optimization until the limit of template deformation and employing a template with which the maximum degree of correlation can be obtained during the optimization process or (2) a method of employing a template corresponding to the median line width from a plurality of templates whose maximum degrees of correlation can exceed the determination threshold value (averaging the line widths of the templates, and employing a template having a line width closest to the average value) may be used. In these methods, since the size margin of the optimized template is large, the template is more insensitive to mark deformation.

In accurate detection after the end of mark search, the mark position can be determined at an accuracy equal to or less than the pixel resolution by, e.g., a method of obtaining the barycenter from a luminance distribution having an origin at the search center of the A/D converted image.

Edge extraction is performed after image reception. Noise removal filtering may be performed before edge extraction to reduce the noise level such that no unnecessary edge information is detected. Addition of such processing can increase the detection ratio in the mark search.

As described above, according to the first embodiment, the template is automatically optimized. With this processing, even when the detection mark cannot be detected by matching of the standard template, a parameter with a higher detection ratio can be searched for and set instead of simply ending the processing. This makes it possible to detect even an image that is conventionally hard to detect, and fine alignment can be executed without stopping the processing in prealignment.

<Second Embodiment>

In the first embodiment, template shape optimization related to a case wherein the line width of a mark becomes thick or thin has been described. In the second embodiment, template optimization related to a case wherein the brightness of a mark changes, as shown in FIGS. 8A to 8F and 8G to 8L will be described. In the second embodiment, bright-field illumination is used, though it is merely an example for descriptive convenience. The second embodiment can also be applied to dark-field illumination. In dark-field illumination, a mark is detected on the basis of scattered light from edges. When the mark portion is flat, and portions except the mark portion are constituted by rough surfaces, the mark portion may look black, and the rough surfaces may look white. That is, the white/black relationship may sometimes be reversed even in dark-field illumination. The second embodiment can be applied to such a case.

FIGS. 8A to 8F show an example (black) in which the background is white, and the mark portion is black. Conversely, FIGS. 8G to 8L show an example (white) in which the background is black, and the mark portion is white. The brightness of the mark portion changes due to the difference in material between the mark and the peripheral portion on a wafer. The light reflectance changes depending on the material. In bright-field illumination, the brightness changes between the mark portion and the peripheral portion.

Figure 8A:
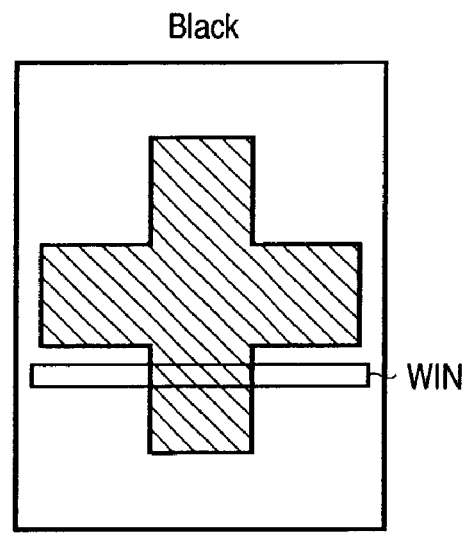
FIGS. 8A to 8F are views for explaining detection mark detection when a substance having a low reflectance is used as the underlying layer of the mark.
Figure 8B:
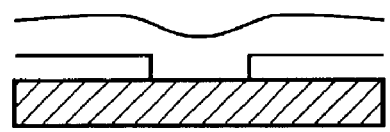
Figure 8C:
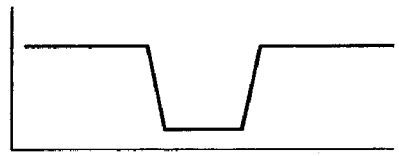
Figure 8D:
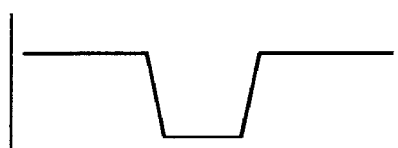
Figure 8E:
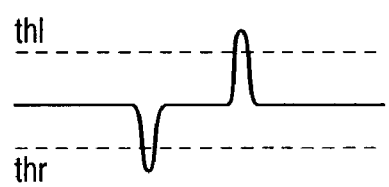
Figure 8F:
Figure 8G:
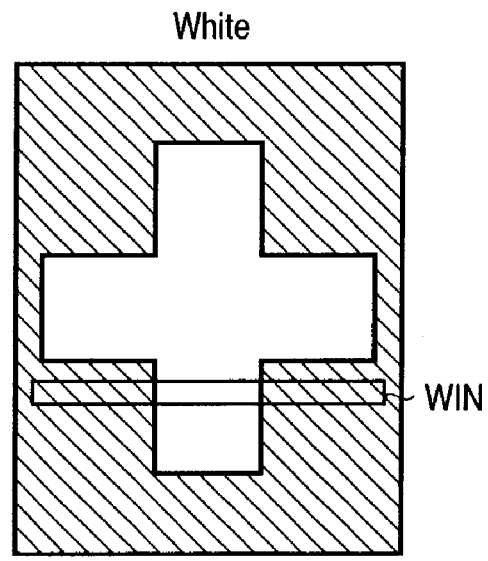
FIGS. 8G to 8L are views for explaining detection mark detection when a substance having a high reflectance is used as the underlying layer of the mark.
Figure 8H:
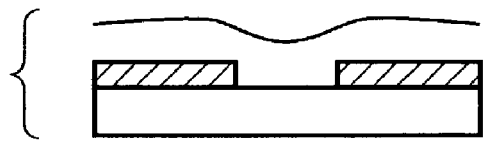
Figure 8I:
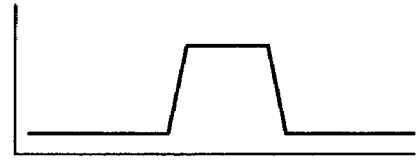
Figure 8J:
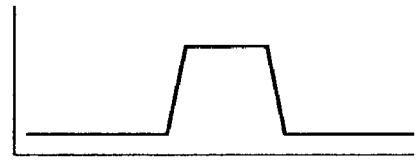
Figure 8K:
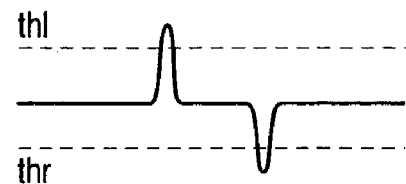
Figure 8L:
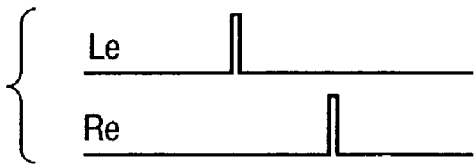
Figure 9:
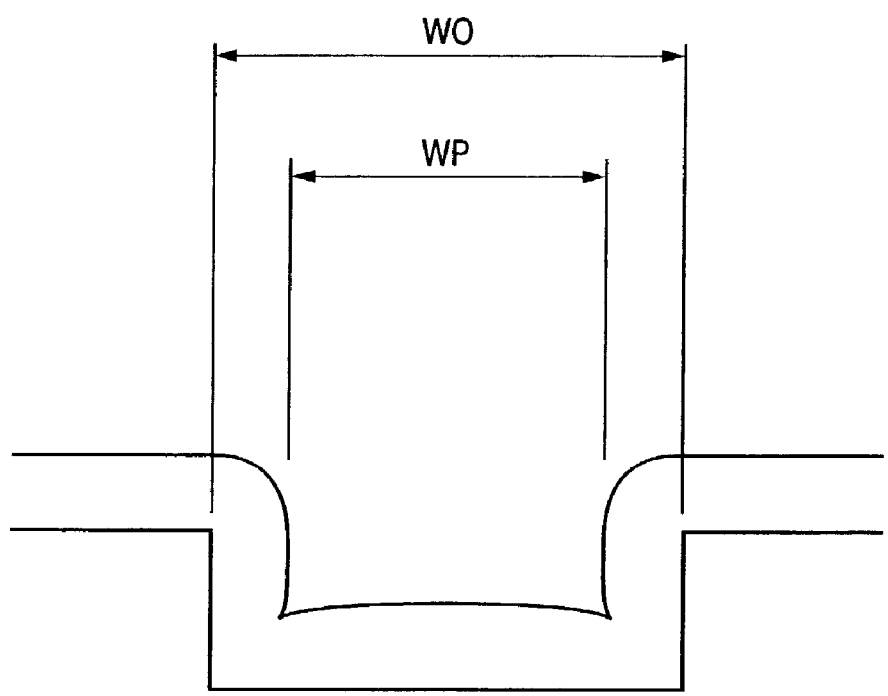
FIG. 9 is a view showing an example of a change in mark line width of a detection mark.

The templates of the marks shown in FIGS. 8A to 8F and 8G to 8L will now be described. As described in the first embodiment, when the mark contour portion is differentiated, and edge direction components are extracted on the basis of threshold values thl, thr, thu, and tho, signals shown in FIGS. 8F and 8L are obtained. For the descriptive convenience, FIGS. 8F and 8L show only the left and right edge components. This also applies to the over and under edges.

As shown in FIGS. 8F and 8L, when the brightness is reversed, the edge directions are reversed, i.e., the left and right edges replace each other although the edge positions do not change. This also applies to the over and under edges, although not illustrated. By using this characteristic, optimization is performed by deforming the template in correspondence with the change in black/white relationship of the mark.

For example, if a template prepared in advance corresponds to a white type (FIGS. 8G to 8L), and the mark that should be detected is of a black type (FIGS. 8A to 8F), the mark cannot be detected. Hence, the degree of correlation is less than the detection determination threshold value. If the degree of correlation is less than the detection determination threshold value, the template is automatically changed to a black type, and template matching is performed again. In this case, since the brightness relationship of the template matches that of the mark to be detected, the degree of correlation is not less than the detection determination threshold value. The template is changed to a black or white type by replacing the left and right edges and the over and under edges while keeping the edge positions unchanged. Replacement of the right and left edges and replacement of the over and under edges have been described above. However, the polarity of the edge detection image may be changed. Definition is changed such that the right edge image changes to the left edge image, the left edge image changes to the right edge image, the over edge image changes to the under edge image, and the under edge image changes to the over edge image. When the correlation between the image and the original template is calculated, the same result as described above can be obtained. That is, replacement of "Left" and "Right" edge detection signals and replacement of "Over" and "Under" edge detection signals may also be used.

As in the first embodiment, the template of a type determined by immediately preceding optimization is self-learned and used for template matching processing of next and subsequent times. If the mark cannot be detected, the template is returned to a white type again. This processing is automatically executed.

As described above, according to the second embodiment, the brightness of a mark is automatically recognized, and pattern matching is continued independently of the brightness type of the mark.

To cope with extensive mark deformation, template optimization corresponding to mark line width deformation described in the first embodiment and template optimization corresponding to a change in mark brightness described in the second embodiment may be combined. Even in this case, when a template whose shape and brightness are optimized by immediately preceding processing is employed as a template for template matching of next and subsequent times, template optimization processing is unnecessary in matching processing of next and subsequent times. Hence, the mark position can be detected in a shortest time.

Template matching processing is not limited to the scheme described in the first and second embodiments. The embodiments can be applied to any processing using a template that describes a two-dimensional space. The embodiments can also be applied to matching using normalized correlation or binary pattern matching.

As described above, according to the first and second embodiments, the edges of a mark image are optimally extracted, and the directional features of the edges are simultaneously extracted. Pattern matching is performed on the basis of the edge positions (over, under, left, and right edge positions) for the respective directions. In addition, since the template is automatically optimized in correspondence with mark deformation or a change in mark brightness, the position of a mark of any type can be detected. That is, any alignment mark to be used for the manufacture of high-density semiconductor devices can stably be detected. As a result, the yield of semiconductor manufacturing increases. In addition, the time when a semiconductor manufacturing apparatus does not operate, i.e., the downtime can be shortened. This increases the reliability and copes with a high-density process in the future.

<Third Embodiment>

In the third embodiment, no-edge portions are added to edge portions as elements that constitute a template. More specifically, the template information described in the first embodiment is extended by adding, as new feature points of interest, portions where no edges are present at all, i.e., portions where the presence of edges is not expected. For example, a prealignment mark 251 shown in FIG. 10 has no edge pattern inside. Hence, when a point that evaluates that no pattern is present inside is added to the template, any detection error can be prevented even at a portion where hole-shaped patterns are densely formed (i.e., any erroneous detection of a detection position 252 in FIG. 10 can be prevented).

An exposure apparatus according to the third embodiment has the same arrangement as that of the first embodiment (FIG. 2A), and a detailed description thereof will be omitted. As for the alignment mark shape, a cross shape (mark 100 in FIG. 3) is employed from the viewpoint of throughput, as in the first embodiment, because both the X- and Y-coordinates can be detected by one mark.

In the third embodiment, dark-field illumination is used as illumination for an off-axis scope. In the dark-field illumination, scattered light from the edge positions of a mark step is received by a CCD camera or the like. This embodiment can also be applied to bright-field illumination.

Figure 11:
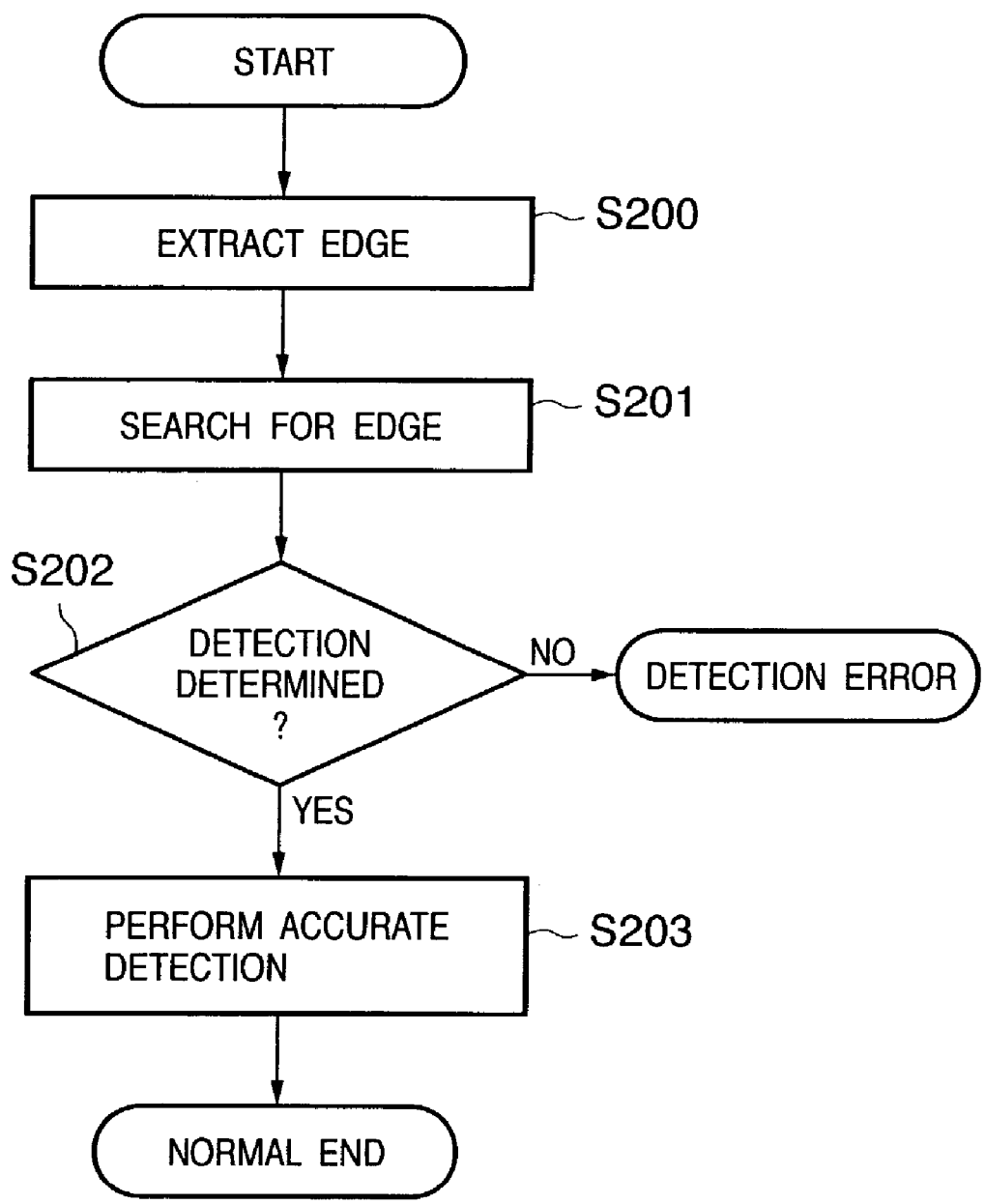
FIG. 11 is a flow chart for explaining prealignment image processing according to the third embodiment.

Prealignment image processing according to the third embodiment will be described below. FIG. 11 is a flowchart for explaining prealignment image processing according to the third embodiment.

The edges of an image received by a CCD camera 7 are extracted by an image processor 82 (step S200). In edge extraction, information representing that an extracted edge is an edge on the over, under, right, or left side of the detection mark signal is also simultaneously acquired. FIGS. 4B to 4E show two-dimensional images when the right edge positions, left edge positions, over edge positions, and under edge positions of the mark 100 are obtained. When these images are synthesized, an image as shown in FIG. 4A is obtained. As a characteristic feature of the third embodiment, the over edge positions in FIG. 4B, under edge positions in FIG. 4C, left edge positions in FIG. 4D, and right edge positions in FIG. 4E are stored as edge position images as independent information.

In step S201, edges are searched for from the edge information extracted in step S200. Search means that the rough position of the detection mark is found in the image. Since the detection mark shape is known, the edge positions are registered and stored in advance. In step S201, matching between a registered template and the edge position image extracted in step S200 is performed. Details of matching processing of the third embodiment will be described later.

In step S202, for the mark detection result obtained in step S201, it is determined whether the mark has been correctly detected. More specifically, if the matching result is equal to or more than the detection determination threshold value, mark search is successfully done. In step S203, the mark is more accurately detected using the mark position searched for in step S201. On the other hand, if the matching result is less than the detection determination threshold value, it is determined as a detection error.

Edge extraction, separation of the over, under, left, and right edges, and the detailed procedure of template matching are the same as in the first embodiment, and a detailed description thereof will be omitted.

Template matching according to the third embodiment will be described next with reference to FIGS. 4A to 4E and 12A to 12F.

Search is performed by template matching between templates shown in FIGS. 12B to 12E, which are stored in advance, and the edge position images shown in FIGS. 4B to 4E. The positions of the over, under, left, and right edges with respect to the mark center (cross) are known in advance. Hence, positions indicated by ○ shown in FIGS. 12B to 12E, at which edges are always present, are registered as templates. Next, positions indicated by X shown in FIG. 12F, at which no edges are present at all, are registered.

Figure 12A:
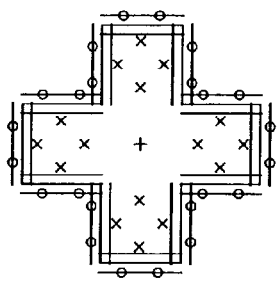
FIGS. 12A to 12F are views for explaining a template according to the third embodiment.
Figure 12B:
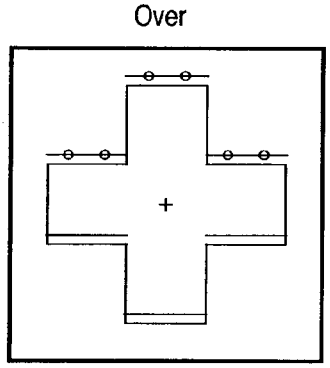
Figure 12C:
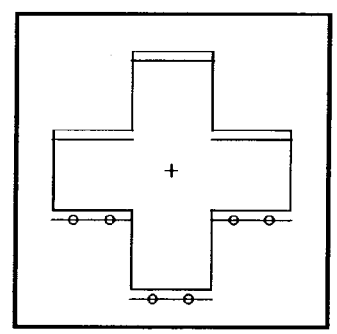
Figure 12F:
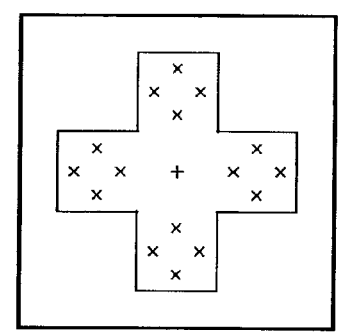
Figure 12D:
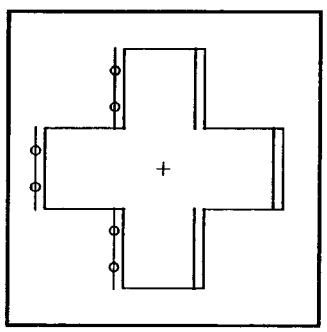
Figure 12E:
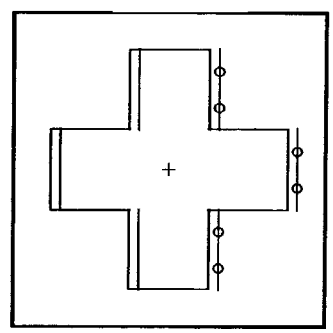

The positions indicated by ○ and X represent the features of the mark. When the registered templates are synthesized, a template shown in FIG. 12A is obtained. Each of the positions indicated by ○ and X is called a feature point of interest. A set of feature points of interest is defined as a template. The feature points of interest indicated by ○ include edges of four types, i.e., over, under, left, and right edges. In this embodiment, these four edge types are not discriminated and will be described as positions of edges. The cross shown in FIGS. 12B to 12F indicates the central portion of the mark.

Template matching in search is performed by determining, for the images shown in FIGS. 4B to 4E, that edge information is present at positions corresponding to all the positions indicated by ○ in FIG. 12A and that edge information is not present at positions corresponding to all the positions indicated by X in FIG. 12A. At this time, when an edge component is present at the position of a feature point of interest indicated by ○, the degree of correlation is increased. When an edge component is present at the position of a feature point of interest indicated by X, the degree of correlation is decreased. When edge information is present at the position of each feature point of interest indicated by ○, and no edge information is present at any one of the positions indicated by X, the degree of correlation is 100%. However, when no edge information is present at any one of the positions indicated by ○, or edge information is present at a position indicated by X, the degree of correlation decreases from 100%. This template matching is performed for the entire edge position image while moving the central position of the mark. Finally, coordinates with the highest degree of correlation are extracted, thus ending the search.

The degree of correlation by template matching will be described in more detail using the image shown in FIG. 10. Template matching is performed by determining, in the image shown in FIG. 10, whether edge information is present at positions corresponding to all the positions indicated by ○ in FIG. 12A and whether edge information is present at positions corresponding to all the positions indicated by X in FIG. 12A. Assume that weight of the degree of correlation of a feature point of interest indicated by ○ is the same as that of a feature point of interest indicated by X in the template shown in FIG. 12A, for the descriptive convenience. The weights are listed in Table 1.

TABLE 1

| Feature point of interest | Edge is present | No edge is present |
|---|---|---|
| ○ | 1.0 | 0.0 |
| X | −1.0 | 0.0 |

The feature points of interest of the template shown in FIG. 12A comprise 24 positions indicated by ○ and 16 positions indicated by X.

Template matching is performed under the above conditions. In the alignment mark 251 shown in FIG. 10, edges are present at all the 24 feature points of interest indicated by ○, and no edge is present at any one of the 16 feature points of interest indicated by X. Hence, the degree of correlation is 24/24=100%. On the other hand, at the detection position 252, edges are present at all the 24 feature points of interest indicated by ○ although edges are also present at all the 16 feature points of interest indicated by X. Hence, the degree of correlation is (24−16)/24=33%. When the degree of correlation at the detection position 251 is compared with that at the detection position 252, the degree of correlation is higher at the detection position 251. Hence, the alignment mark 251 is determined as the correct detection position.

In the above description, the weight of the feature point of interest indicated by ○ is the same as that of the feature point of interest indicated by X. However, the weights may be different. In this case, the calculation result of the degree of correlation changes. For example, with an emphasis placed on the feature points of interest indicated by X, a weight of 1.5 is added to them. At the detection position 251, the degree of correlation is (24)/24=100%. At the detection position 252, the degree of correlation is (24−16×1.5)/24=0%. In this way, the pattern identifiability at the detection positions 251 and 252 can be increased by the weight.

In the above description, the template places an emphasis on that edges are present at the positions indicated by ○ and the positions indicated by X. However, the degree of correlation may be increased when edge components are present at the feature points of interest indicated by ○, and the degree of matching may also be increased even when no edge component is present at a feature point of interest indicated by X. The weights for template matching in this case are listed in Table 2.

TABLE 2

| Feature point of Edge interest | Edge is present | No edge is present |
|---|---|---|
| ○ | 1.0 | 0.0 |
| X | 0.0 | 1.0 |

The degree of correlation by the template matching will be described in more detail with reference to the image shown in FIG. 10. Template matching is performed using the weights shown in Table 2. At the detection position 251, edges are present at all the 24 feature points of interest indicated by ○, and no edge is present at any one of the 16 feature points of interest indicated by X. Hence, the degree of correlation is (24+16)/(24+16)=100%. On the other hand, at the position 252, edges are present at all the 24 feature points of interest indicated by ○ although edges are also present at the 16 feature points of interest indicated by X. Hence, the degree of correlation is (24+0)/(24+16)=60%. When the degree of correlation at the detection position 251 is compared with that at the detection position 252, the degree of correlation is higher at the detection position 251. Hence, the detection position 251 is determined as the correct detection position.

The above-described template matching can be modified within the spirit and scope which can be anticipated by those who are skilled in the art. For example, the weights shown in Tables 1 and 2 described above may be combined, and a template shown in Table 3 may be used.

TABLE 3

| Feature point of interest | Edge is present | No edge is present |
|---|---|---|
| ○ | 1.0 | 0.0 |
| X | −1.0 | 1.0 |

Figure 10:
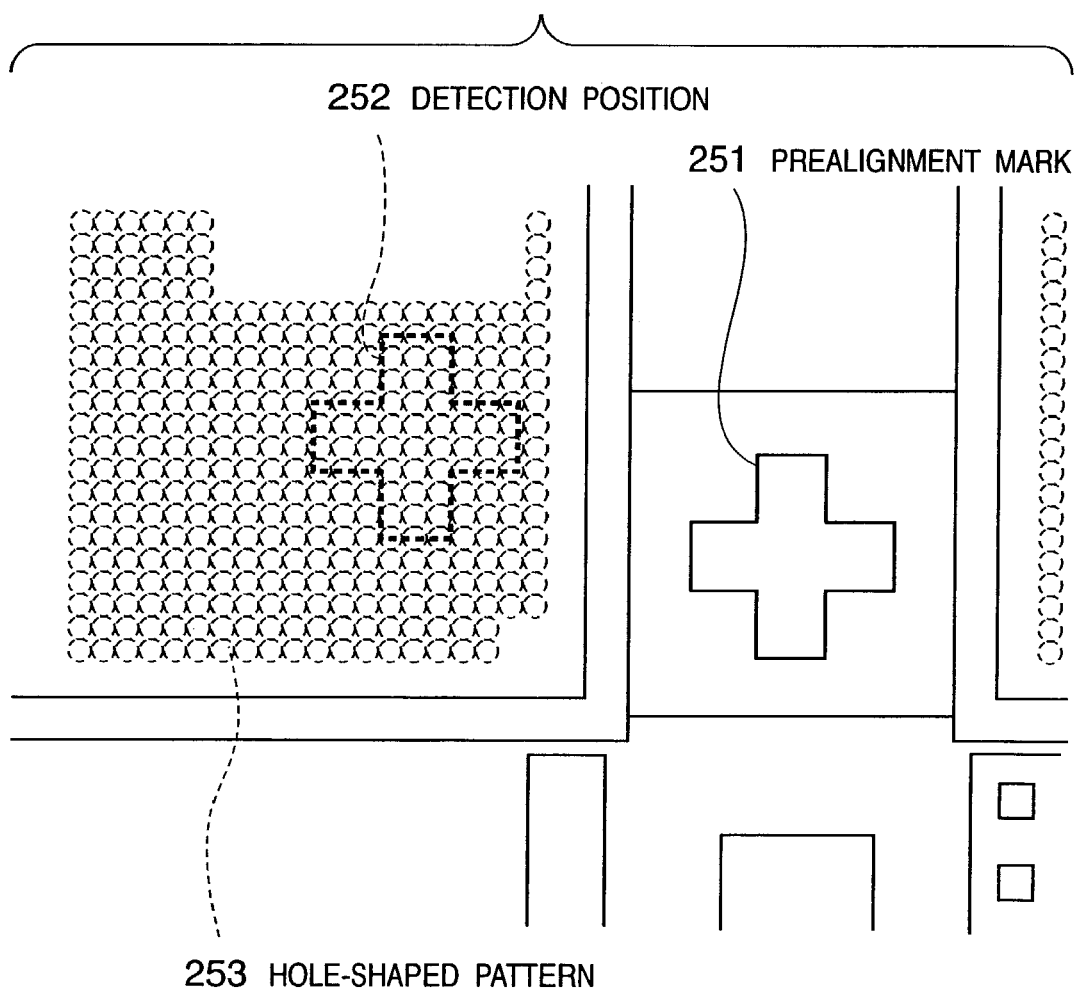
FIG. 10 is a view showing an example of a wafer surface including a prealignment mark 251 and hole-shaped patterns 253.

In template matching shown in Table 3, the degrees of correlation at the detection positions 251 and 252 in FIG. 10 are calculated as follows. At the detection position 251, (24+16)/(24+16)=100%. At the detection position 252, (24−16)/(24+16)=20%.

When the feature points of interest indicated by X are introduced, the identifiability between a true mark and a similar mark increases. The identification effect is largest in the template matching method shown in Table 3.

As described above, when template matching is performed using a template of the third embodiment, the correct detection position is obtained. However, since the number of feature points of interest of the template increases, the time required for calculation increases. When an increase in calculation time must be taken into consideration, the following method may be used.

A description will be made using the flow chart shown in FIG. 11. In the first processing in step S201, templates having only the feature points of interest indicated by ○ shown in FIGS. 12B to 12E are used. Template matching is performed to determine with respect to the mark center in the image shown in FIG. 4A whether edge information is present at each of the positions indicated by ○ in FIGS. 12B to 12E. If it is determined as the result of this matching that a plurality of detection positions are present, the flow returns from step S202 to step S201. In the second processing in step S201, templates having the feature points of interest indicated by ○ and X shown in FIGS. 12B to 12E are used, and template matching is performed under any one of the above-described conditions. In this way, the combination of feature points of interest is changed to obtain a template having only the points indicated by ○ or a template having the points indicated by ○ and X. When the number of feature points of interest is increased as needed, both the increase in the mark detection ratio and the increase in detection speed can simultaneously be satisfied.

In this case, instead of introducing all the feature points of interest indicated by X at once, the number of feature points of interest may gradually be increased. In, e.g., the above example, eight of the 16 feature points of interest may be introduced first in the second processing in step S201. If the detection candidates cannot be narrowed down with this processing, the number of feature points of interest may be increased to 12 in the third processing in step S201 and then to 16 in the fourth processing. The feature points of interest indicated by ○ and those indicated by X may be combined, and their numbers may be changed (for example, 16 feature points of interest indicated by ○ and eight features point of interest indicated by X are used in the first processing, and 20 feature points of interest indicated by ○ and 12 features point of interest indicated by X are used in the second processing).

In addition, the combination of feature points of interest, which is determined by this method, is used for template matching of a next time. This is very effective for increasing the detection speed.

<Fourth Embodiment>

Figure 13:
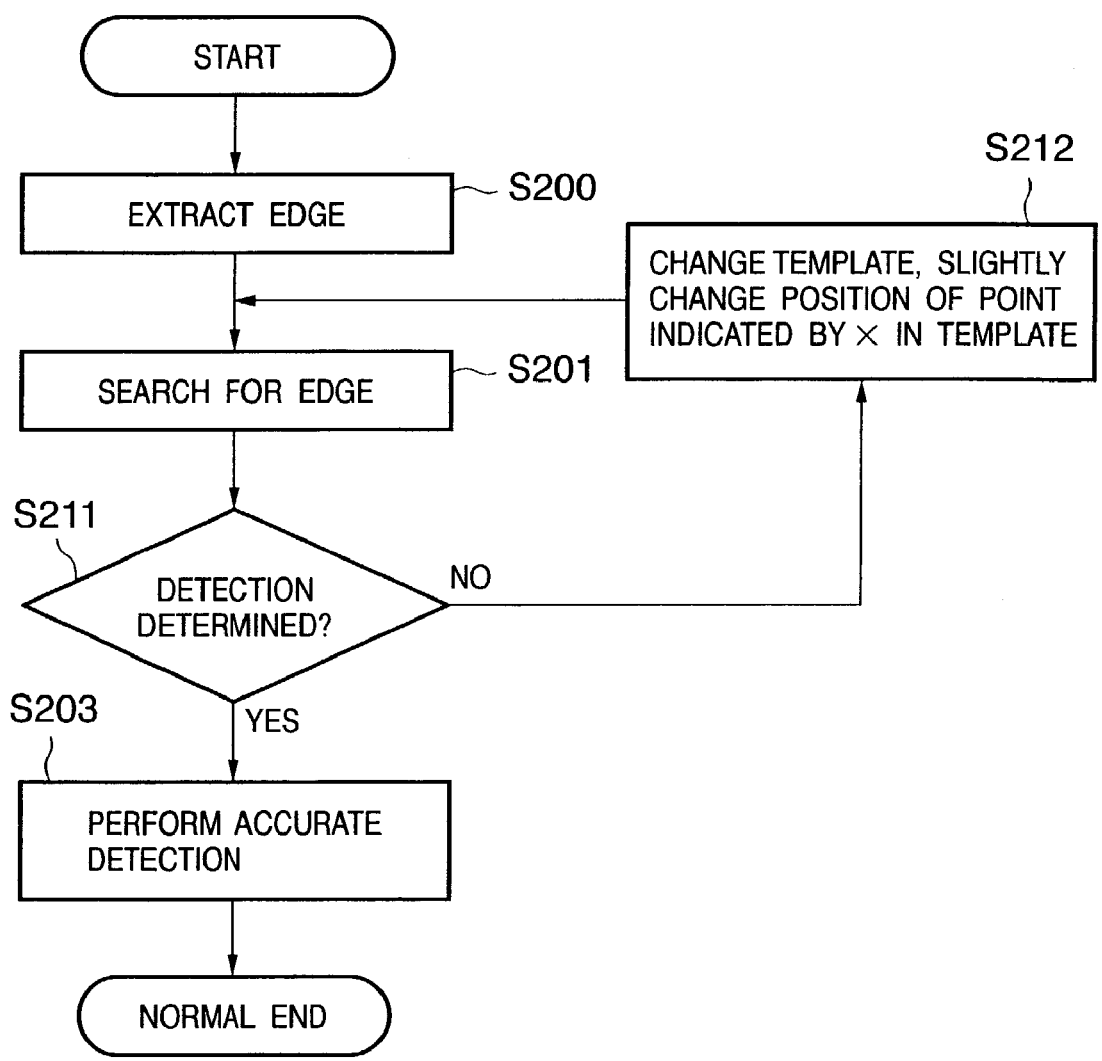
FIG. 13 is a flow chart for explaining prealignment image processing according to the fourth embodiment.

In the fourth embodiment, template matching, which can prevent any erroneous detection of a hole-shaped pattern even when a mark which should be detected partially breaks and is hard to detect, will be described. FIG. 13 is a flow chart for explaining prealignment image processing according to the fourth embodiment. The same step numbers as in the flow chart of FIG. 11 denote steps having the same functions in FIG. 13, and a description thereof will be omitted.

Sometimes, after search, the degree of correlation of the mark position is low because of, e.g., partial break of the mark, and a plurality of detection mark candidate points are detected, resulting in a detection error. In this case, as shown in step S212, the positions of a feature point of interest indicated by X are slightly changed, and a search is performed again. With this processing, the degree of correlation or the detection position of a pattern such as a hole-shaped pattern 253 that is present at a position except for the mark changes in accordance with the positions of the feature points of interest indicated by X. On the other hand, the true mark is not influenced by movement of the feature points of interested indicated by X, and its degree of correlation and detection position do not change because no edge information is present at the feature points of interest indicated by X.

In this way, a point whose degree of correlation or detection position is stable even after the positions of the feature points of interest (indicated by X) at which no edge information is present are changed can be identified as the true mark position. Hence, in step S211 after step S212, a function of identifying one of the plurality of candidate points, at which the degree of correlation and position are stable, is also executed.

The detection criterion in step S211 is as follows.

(1) When the number of detection positions whose degrees of correlation exceed the set threshold value is one, detection is ended. The position is determined as the mark detection position.

(2) When the feature points of interest indicated by X are changed, a position whose degree of correlation changes every time the positions of the feature points of interest indicated by X are changed is excluded from the determination position.

a position which appears every time the positions of the feature points of interest indicated by X are changed is excluded from the determination position.

(3) When the number of detection positions which are not excluded from the determination position is one, the position is determined as the mark detection position.

Furthermore, when template matching of a next time is executed using the position of the feature point of interest determined by this method, the template is also optimized.

As described above, according to the third and fourth embodiments, portions at which edges are present and a portion at which no edges are present are used as feature points of interest in forming a template. In template matching, even when a pattern such as the hole-shaped pattern 253 having a feature similar to an edge portion is present on a wafer, the degree of correlation at that portion can be decreased, and the correct mark position can be detected. When the portions at which no edges are present are used as feature points of interest, any mark detection error can be effectively prevented.

<Fifth Embodiment>

The first to fourth embodiments are applied to prealignment using an off-axis microscope. However, mark position search, template optimization and a self-learning function, which have been described in the first and second embodiments, and matching processing using the positions of feature points of interest at which no edges are present, which has been described in the third and fourth embodiments, are not limited to prealignment using an off-axis microscope. These processing operations can be applied to, e.g., the following position detection system.

Figure 2B:
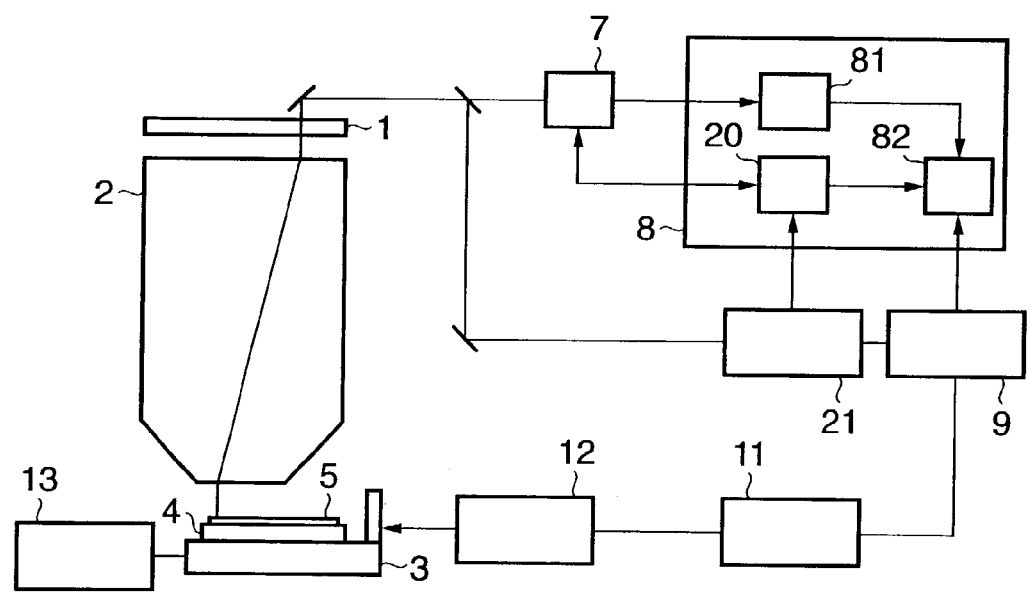
FIG. 2B is a view showing the schematic arrangement of a semiconductor exposure apparatus according to another embodiment.

FIG. 2B is a view showing an embodiment of a TTR (Through The Reticle) detection system which detects a mark on a wafer or a stage through a reticle. In the TTR, the mark is detected by exposure light. In, e.g., an excimer laser exposure apparatus, a CCD camera 7 and laser 21 are synchronized by a sync signal generator 20. The laser is oscillated only during an optical accumulation time of the CCD camera 7. Using a thus photoelectrically converted mark image, mark position search, template optimization, and self-learning are executed in accordance with the same procedure as in the first to fourth embodiments. Then, after search, accurate mark calculation is performed.

When i-line is used in place of the excimer laser, image reception and an illumination system need not be synchronized. However, the remaining parts are the same as described above.

Figure 2C:
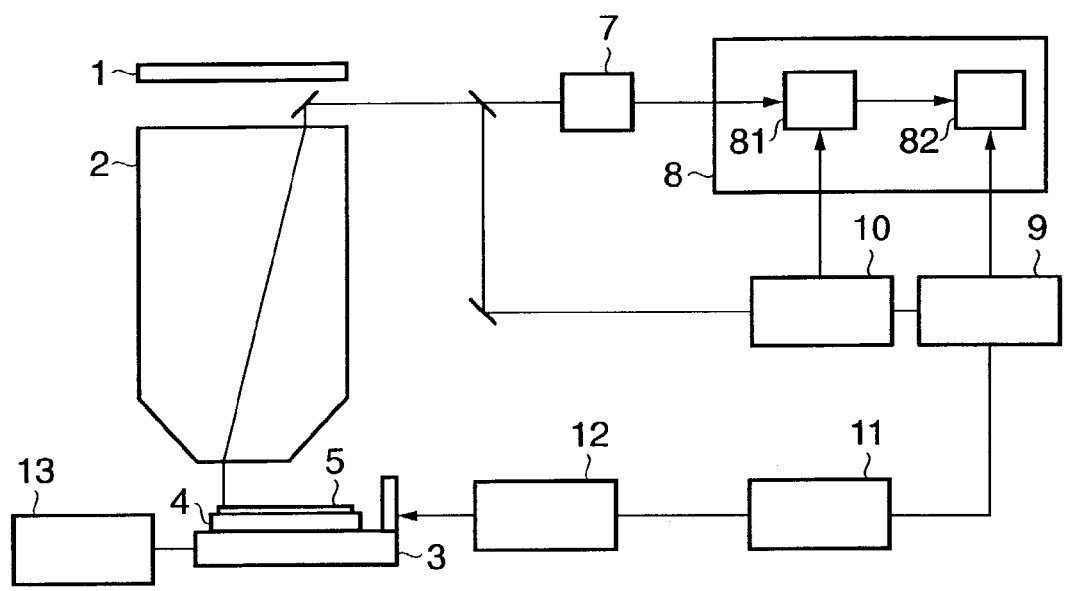
FIG. 2C is a view showing the schematic arrangement of a semiconductor exposure apparatus according to still another embodiment.

As another example, FIG. 2C shows an embodiment of a TTL (Through The Lens) detection system which detects a mark on a wafer or a stage not through a reticle, but through a projecting lens. In this case as well, mark search, template optimization, and the self-learning function are the same as in the first to fourth embodiments except for the mark sensing method.

The position detection according to the above embodiments can also be applied to position detection of a wafer in an electron beam (EB) exposure apparatus (not shown) which uses no reticle. Even in the EB exposure apparatus, mark search and position determination can be performed in accordance with the same procedure as in the first to fourth embodiments.

In addition, search using the feature points of interest described in the third and fourth embodiments can also be applied to the templates described in the first and second embodiments.

<Other Embodiments>

[Application to a Semiconductor Manufacturing Apparatus]

Figure 14:
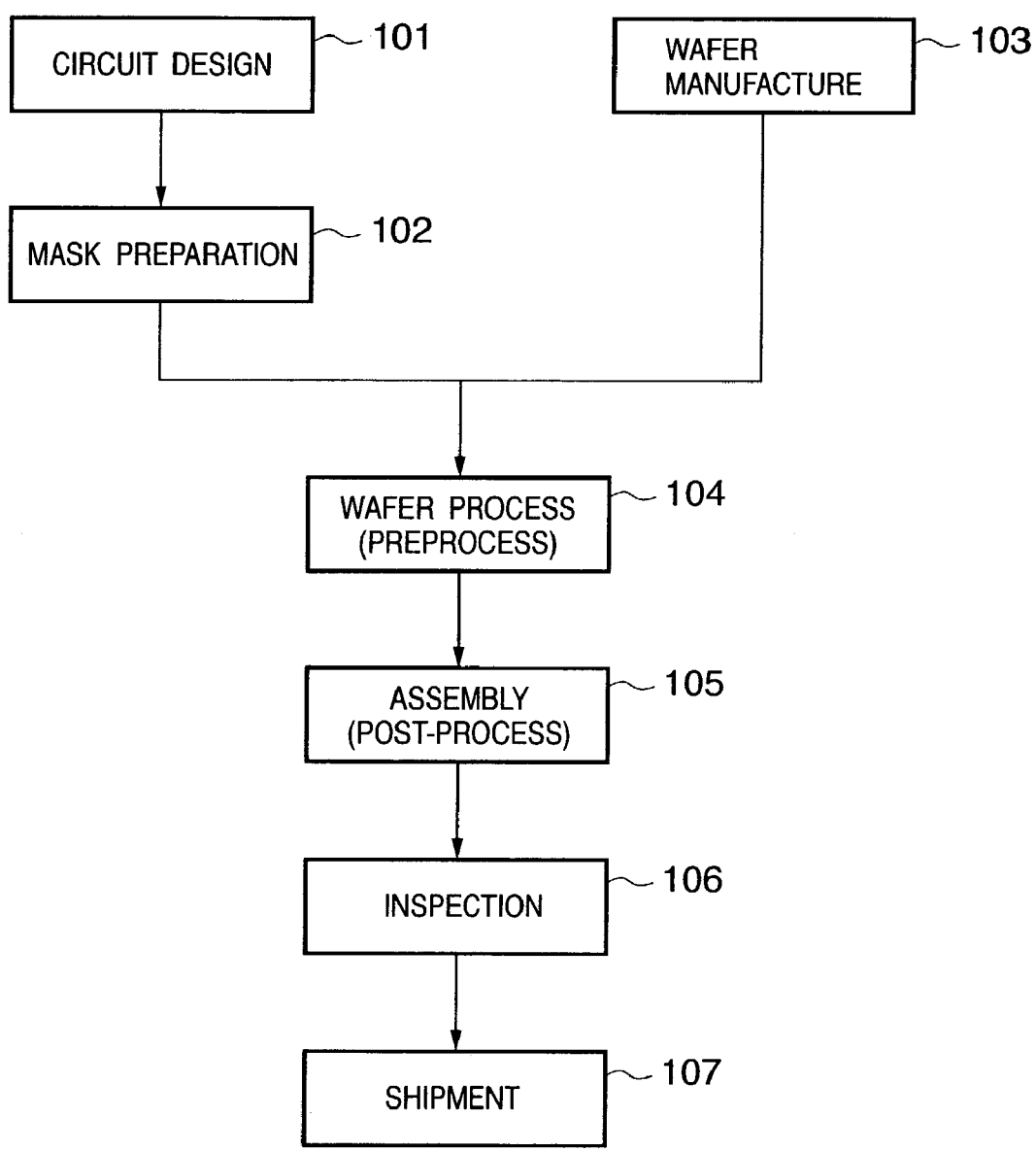
FIG. 14 is a flow chart showing a semiconductor device manufacturing flow.

An embodiment of a device manufacturing method using the above-described exposure apparatus will be described next. FIG. 14 shows a manufacturing flow of a microdevice (e.g., a semiconductor chip such as an IC or an LSI, a liquid crystal panel, a CCD, a thin-film magnetic head, or a micromachine).

In step S101 (circuit design), the circuit of a semiconductor device is designed. In step 102 (mask preparation), a mask having the designed circuit pattern is prepared. In step 103 (wafer manufacture), a wafer is manufactured using a material such as silicon. In step 104 (wafer process), called a preprocess, an actual circuit is formed on the wafer by lithography using the prepared mask and wafer. In step 105 (assembly), called a post-process, a semiconductor chip is formed from the wafer prepared in step 104. This step includes processes such as assembly (dicing and bonding) and packaging (chip encapsulation). In step 106 (inspection), inspections including an operation check test and a durability test of the semiconductor device manufactured in step 105 are performed. A semiconductor device is completed with these processes and shipped (step 107).

Figure 15:
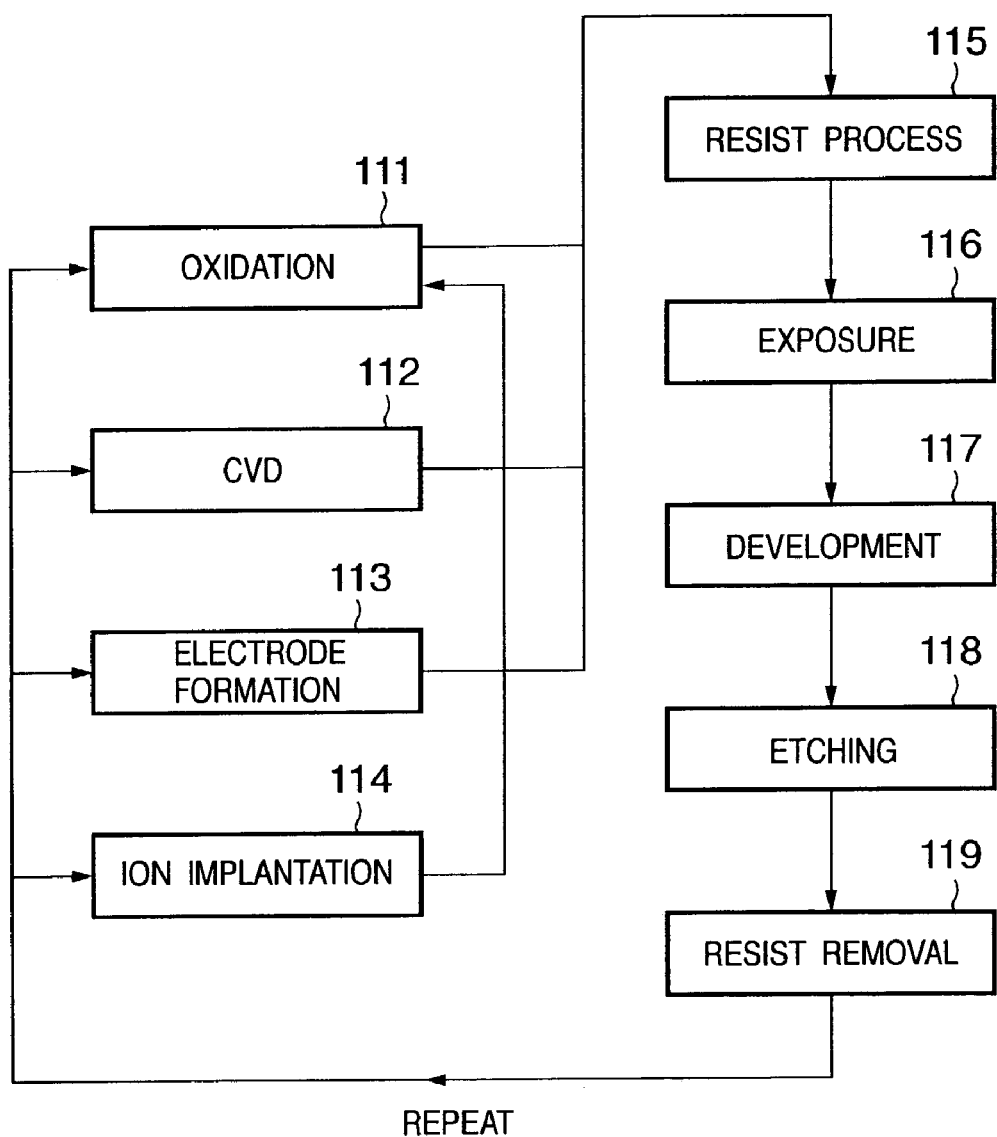
FIG. 15 is a flow chart showing a detailed flow of a wafer process.

FIG. 15 shows a detailed flow of the wafer process. In step 111 (oxidation), the surface of the wafer is oxidized. In step 112 (CVD), an insulating film is formed on the wafer surface. In step 113 (electrode formation), an electrode is formed on the wafer by deposition. In step 114 (ion implantation), ions are implanted into the wafer. In step 115 (resist process), a sensitizer is applied to the wafer. In step 116 (exposure), the circuit pattern of the mask is printed on the wafer by the above-described exposure apparatus. In step 117 (development), the exposed wafer is developed. In step 118 (etching), portions other than the developed resist image are etched. In step 119 (resist removal), any unnecessary resist remaining after etching is removed. By repeating these steps, a multilayered structure of circuit patterns is formed on the wafer.

When the exposure apparatus described in the first to fifth embodiments is used for the above manufacturing method, an alignment mark can stably be detected from any alignment mark image. Hence, the yield of semiconductor manufacturing increases. In addition, the downtime is shortened, and the throughput increases.

As has been described above, according to the present invention, stabler mark detection can be performed even when a detection mark changes during the manufacturing process.

In addition, according to the present invention, it is made possible to flexibly cope with a change in mark line width or mark brightness.

Furthermore, according to the present invention, any mark detection error can be prevented, and a predetermined mark can more reliably be detected.

As many apparently widely different embodiments of the present invention can be made without departing from the spirit and scope thereof, it is to be understood that the invention is not limited to the specific embodiments thereof except as defined in the appended claims.

What is claimed is:

1. A method of detecting a position of a mark within image data, said method comprising:
   a first step of obtaining a first position of the mark based on a first degree of correlation between a first template and the image data, the first template having a first feature point to obtain the first degree of correlation;
   a second step of obtaining a second position of the mark based on a second degree of correlation between a second template and the image data, the second template having a second feature point, of which a position is different from that of the first feature point, to obtain the second degree of correlation; and
   a third step of detecting the position of the mark through said first and second steps.

2. A method according to claim 1, wherein each of the positions of the first and second feature points corresponds to a position of an edge of the mark within the image data.

3. A method according to claim 2, wherein each of the first and second templates represents a plurality of the positions of the edge.

4. A method according to claim 1, further comprising a step of generating the second template by moving the first feature point in the first template.

5. A method according to claim 1, further comprising a step of preparing the first and second templates in a memory.

6. A method according to claim 1, wherein the second step is executed if the first degree of correlation is less than a threshold.

7. A method according to claim 1, wherein the first template has a plurality of the first feature points, the plurality of the first feature points corresponding to a position of a first edge of the mark within the image data and a position of a region different from the first edge within the image data, and the second template has a plurality of the second feature points, the plurality of the second feature points corresponding to a position of a second edge of the mark within the image data and a position of a region different from the second edge within the image data.

8. A method according to claim 6, further comprising a step of setting the second template as the first template later if the second degree of correlation is not less than a threshold.

9. A method according to claim 1, further comprising another step of which the second template has another of the second feature points, and a step of setting one of the plurality of the second templates as the first template later if the second degree of correlation with respect to the one of the plurality of the second templates is maximum among those with respect to the plurality of the second templates.

10. A method according to claim 2, wherein the first feature point and the second feature point are different in polarity of the edge.

11. A method according to claim 2, further comprising a step of obtaining the image data by extracting an edge of the mark in the image data.

12. A method according to claim 1, wherein the first template has a plurality of the second feature points, the plurality of the first feature points corresponding to a position of an edge of the mark within the image data, and the second templates have a plurality of the second feature points, the plurality of the second feature points corresponding to the position of the edge and a position of a region different from the edge within the image data.

13. A method according to claim 9, wherein the plurality of the second templates is different from each other in number of the second feature point.

14. A method according to claim 7, wherein the first template has a plurality of the first feature points, the plurality of the first feature points corresponding to a position of a first edge of the mark within the image data and a position of a first region different from the first edge within the image data, and the second template has a plurality of the second feature points, the plurality of the second feature points corresponding to the position of the first edge and a position of a second region different from the first edge and the first region within the image data, and said third step detects the position of the mark based on at least one of a first difference between the first and second positions and a second difference between the first and second degrees of correlation.

15. A method of manufacturing a device, said method comprising steps of:
   capturing an image of a mark on a substrate to obtain image data;
   detecting a position of the mark within the image data using a method as defined in claim 1;
   positioning the substrate based on the detected position;
   exposing the positioned substrate to a pattern;
   developing the exposed substrate; and
   processing the developed substrate to manufacture the device.

16. An exposure apparatus for exposing a substrate to a pattern, said apparatus comprising:
   a capture unit to capture an image of a mark on the substrate to obtain image data;
   a detection apparatus, for detecting a position of the mark within the image data, using a method of detecting a position of a mark within image data, as defined in claim 1;
   a positioning unit to position the substrate based on the position detected by said detection apparatus; and
   an exposure unit to expose the substrate positioned by said positioning unit to a pattern.

17. A method of manufacturing a device, said method comprising steps of:
   exposing a substrate to a pattern using an exposure apparatus as defined in claim 16;
   developing the exposed substrate; and
   processing the developed substrate to manufacture the device.

18. A detection apparatus for detecting a position of a mark within image data, said apparatus comprising:
   a first unit to obtain a first position of the mark based on a first degree of correlation between a first template and the image data, the first template having a first feature point to obtain the first degree of correlation;
   a second unit to obtain a second position of the mark based on a second degree of correlation between a second template and the image data, the second template having a second feature point, of which a position is different from that of the first feature point, to obtain the second degree of correlation; and
   a third unit to detect the position of the mark based on outputs of said first and second units.

* * * * *